(12) United States Patent
Onoya et al.

(10) Patent No.: US 11,758,745 B2
(45) Date of Patent: Sep. 12, 2023

(54) SOLID-STATE RELAY AND SEMICONDUCTOR DEVICE

(71) Applicant: SEMICONDUCTOR ENERGY LABORATORY CO., LTD., Atsugi (JP)

(72) Inventors: Shigeru Onoya, Kanagawa (JP);
Noboru Inoue, Kanagawa (JP);
Takahiro Fukutome, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/600,906

(22) PCT Filed: Apr. 7, 2020

(86) PCT No.: PCT/IB2020/053291
§ 371 (c)(1),
(2) Date: Oct. 1, 2021

(87) PCT Pub. No.: WO2020/212800
PCT Pub. Date: Oct. 22, 2020

(65) Prior Publication Data
US 2022/0190270 A1 Jun. 16, 2022

(30) Foreign Application Priority Data

Apr. 18, 2019 (JP) ................. 2019-079044

(51) Int. Cl.
*H10K 50/00* (2023.01)
*H01L 21/8234* (2006.01)
(Continued)

(52) U.S. Cl.
CPC ......... *H10K 50/00* (2023.02); *H01L 21/8234* (2013.01); *H01L 27/0629* (2013.01); *H01L 27/0727* (2013.01); *H01L 31/167* (2013.01)

(58) Field of Classification Search
CPC . H01L 51/50; H01L 21/8234; H01L 27/0629; H01L 27/0727; H01L 27/1207;
(Continued)

(56) References Cited

U.S. PATENT DOCUMENTS 4,212,024 A * 7/1980 Sugawara ............. H01L 31/167
257/113
5,753,928 A * 5/1998 Krause .................. H01L 31/173
250/214.1
(Continued)

FOREIGN PATENT DOCUMENTS

CN 001292603 A 4/2001
CN 105097957 A 11/2015
(Continued)

OTHER PUBLICATIONS

International Search Report (Application No. PCT/IB2020/053291) dated Jul. 21, 2020.
(Continued)

*Primary Examiner* — Sitaramarao S Yechuri
(74) *Attorney, Agent, or Firm* — Fish & Richardson P.C.

(57) ABSTRACT

A solid-state relay having favorable electrical characteristics is provided. The solid-state relay includes a first circuit and a second circuit. The first circuit includes a first light-emitting element. The second circuit includes a first light-receiving element, a memory, and a first switch. The memory includes a second switch. The second switch includes a second semiconductor layer. The first switch and the first light-emitting element are formed using a first semiconductor layer. The first semiconductor layer and the second semiconductor layer contain gallium, and the second semiconductor layer further contains oxygen. On or off of the first light-emitting element is controlled by a first signal supplied to the first circuit. First data, which is generated when the first light-receiving element converts light emitted
(Continued)

by the first light-emitting element into voltage, is supplied to the memory. Conduction or non-conduction of the first switch is controlled by the first data stored in the memory.

11 Claims, 10 Drawing Sheets

(51) Int. Cl.
  *H01L 27/06* (2006.01)
  *H01L 27/07* (2006.01)
  *H01L 31/167* (2006.01)

(58) Field of Classification Search
  CPC ... H01L 27/07; H01L 27/1214; H01L 31/167; H01L 31/173; H01L 29/778; H01L 29/78; H01L 29/812; H01L 29/786; H03K 17/78; H03K 17/785
  See application file for complete search history.

(56) References Cited

U.S. PATENT DOCUMENTS

| | | | |
|---|---|---|---|
| 6,339,236 | B1 | 1/2002 | Tomii et al. |
| 8,860,016 | B2 | 10/2014 | Suzuki |
| 8,947,155 | B2 | 2/2015 | Takahashi et al. |
| 9,070,817 | B2 | 6/2015 | Fujimoto et al. |
| 9,379,190 | B2 | 6/2016 | Hitora et al. |
| 10,217,736 | B2 | 2/2019 | Kato et al. |
| 10,270,436 | B2 * | 4/2019 | Chen .................. H01L 29/2003 |
| 2004/0042707 | A1 | 3/2004 | Imai et al. |
| 2010/0133523 | A1 | 6/2010 | Nowatari et al. |
| 2010/0133573 | A1 | 6/2010 | Nowatari et al. |
| 2010/0301316 | A1 | 12/2010 | Nowatari et al. |
| 2010/0301317 | A1 | 12/2010 | Nowatari et al. |
| 2011/0315968 | A1 | 12/2011 | Nowatari et al. |
| 2012/0097982 | A1 | 4/2012 | Wakimoto et al. |
| 2012/0126725 | A1 | 5/2012 | Wakimoto |
| 2013/0020566 | A1 | 1/2013 | Suzuki |
| 2013/0044917 | A1 | 2/2013 | Kurokawa |
| 2013/0162778 | A1 | 6/2013 | Kurokawa |
| 2013/0257699 | A1 | 10/2013 | Yamazaki et al. |
| 2013/0265098 | A1 * | 10/2013 | Takahashi ............ H03K 17/687 327/434 |
| 2013/0293138 | A1 | 11/2013 | Takahashi |
| 2013/0299841 | A1 * | 11/2013 | Ranglack .............. H01L 25/167 257/E33.025 |
| 2013/0321366 | A1 | 12/2013 | Kozuma et al. |
| 2014/0084305 | A1 | 3/2014 | Fujimoto et al. |
| 2014/0204696 | A1 | 7/2014 | Kato et al. |
| 2014/0264518 | A1 | 9/2014 | Matsuzaki |
| 2014/0269013 | A1 | 9/2014 | Tsutsui et al. |
| 2014/0293711 | A1 | 10/2014 | Kato et al. |
| 2015/0084046 | A1 | 3/2015 | Kato et al. |
| 2015/0200668 | A1 | 7/2015 | Uesugi et al. |
| 2015/0262642 | A1 | 9/2015 | Koyama |
| 2015/0263052 | A1 | 9/2015 | Yamazaki et al. |
| 2015/0279884 | A1 | 10/2015 | Kusumoto |
| 2015/0325659 | A1 | 11/2015 | Hitora et al. |
| 2015/0340094 | A1 | 11/2015 | Tamura |
| 2015/0346866 | A1 | 12/2015 | Kusunoki et al. |
| 2015/0349041 | A1 | 12/2015 | Miyake |
| 2016/0178409 | A1 | 6/2016 | Tsutsui |
| 2016/0248031 | A1 | 8/2016 | Seo |
| 2017/0012232 | A1 | 1/2017 | Kataishi et al. |
| 2017/0318632 | A1 * | 11/2017 | Simin ..................... H01L 27/15 |
| 2019/0027436 | A1 * | 1/2019 | Lum .................. H01L 23/5225 |
| 2019/0260310 | A1 * | 8/2019 | Takano .................. H03K 17/16 |
| 2021/0005669 | A1 | 1/2021 | Kamada et al. |
| 2021/0066669 | A1 | 3/2021 | Kubota et al. |
| 2021/0096678 | A1 | 4/2021 | Kubota et al. |
| 2021/0296409 | A1 | 9/2021 | Yamazaki et al. |
| 2021/0391388 | A1 | 12/2021 | Nakagawa et al. |

FOREIGN PATENT DOCUMENTS

| | | |
|---|---|---|
| EP | 1087527 A | 3/2001 |
| EP | 2942803 A | 11/2015 |
| JP | 2001-284623 A | 10/2001 |
| JP | 2003-115751 A | 4/2003 |
| JP | 2009-302587 A | 12/2009 |
| JP | 2011-228623 A | 11/2011 |
| JP | 2013-232885 A | 11/2013 |
| JP | 2014-063927 A | 4/2014 |
| JP | 2015-084418 A | 4/2015 |
| JP | 2015-228495 A | 12/2015 |
| JP | 2017-126986 A | 7/2017 |
| KR | 2001-0039929 A | 5/2001 |
| KR | 2013-0018730 A | 2/2013 |
| WO | WO-2011/125526 | 10/2011 |

OTHER PUBLICATIONS

Written Opinion (Application No. PCT/IB2020/053291) dated Jul. 21, 2020.

* cited by examiner

FIG. 9A
| Amorphous | Crystalline | Crystal |
|---|---|---|
| completely amorphous | ·CAAC<br>·nc<br>·CAC<br>excluding single crystal and poly crystal | ·single crystal<br>·poly crystal |
Intermediate state
New crystalline phase
FIG. 9B
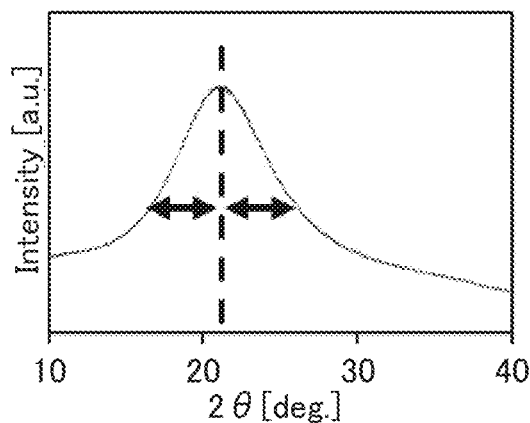
FIG. 9C
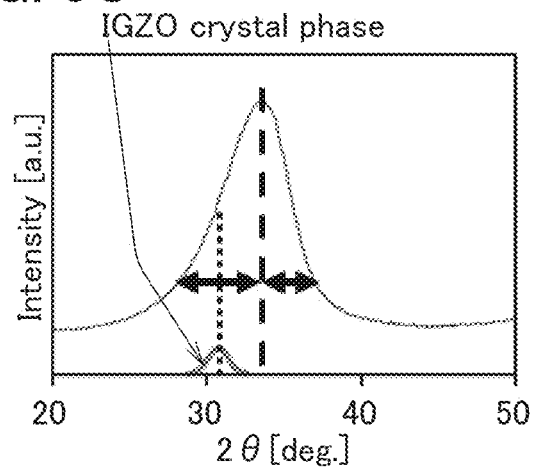
IGZO crystal phase
FIG. 9D
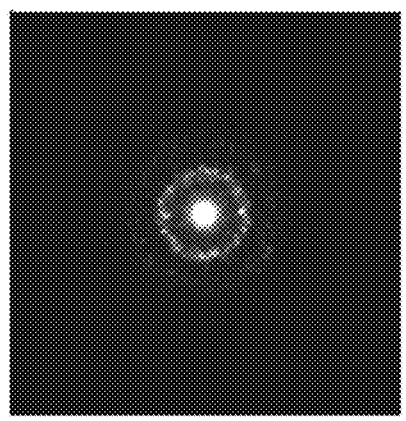

SOLID-STATE RELAY AND SEMICONDUCTOR DEVICE

CROSS REFERENCE TO RELATED APPLICATIONS

This application is a U.S. National Phase Application under 35 U.S.C. § 371 of International Application PCT/IB2020/053291, filed on Apr. 7, 2020, which is incorporated by reference and claims the benefit of a foreign priority application filed in Japan on Apr. 18, 2019, as Application No. 2019-079044.

TECHNICAL FIELD

One embodiment of the present invention relates to a solid-state relay, a latching solid-state relay, and a semiconductor device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, or an input device, an input/output device.

Note that in this specification and the like, a semiconductor device generally means a device that can function by utilizing semiconductor characteristics. A transistor, a semiconductor circuit, an arithmetic device, a memory device, and the like are each an embodiment of the semiconductor device. In addition, a communication device, an imaging device, an electro-optical device, a power generation device (including a thin film solar cell, an organic thin film solar cell, and the like), and an electronic device may include a semiconductor device.

BACKGROUND ART

A solid-state relay includes a first circuit and a second circuit. The second circuit includes a first terminal and a second terminal. When a signal is supplied to the first circuit, a switch included in the second circuit is controlled and conduction or non-conduction between the first terminal and the second terminal is controlled. Specifically, when a signal is supplied to the first circuit, a light-emitting element is turned on and electromotive force is generated in a light-receiving element included in the second circuit. The switch is controlled by the electromotive force, and conduction or non-conduction of the switch is controlled. Accordingly, the non-contact solid-state relay that transmits signals with the light-emitting element and the light-receiving element has excellent reliability as compared to, for example, a reed relay with a mechanical contact.

A latching solid-state relay is a kind of solid-state relays. A latching solid-state relay requires power at the time of changing the conduction or non-conduction state of the switch but does not require power at the time of keeping the state. Thus, the power consumption of the solid-state relay can be low. Patent Document 1 mentioned below discloses a non-contact solid-state relay having a latching function. As for the latching function, a solid-state relay is disclosed in which a memory with a transistor including a metal oxide in a semiconductor layer is used in order to store the state.

REFERENCE

Patent Document

[Patent Document 1] Japanese Published Patent Application No. 2017-126986

SUMMARY OF THE INVENTION

Problems to be Solved by the Invention

The power consumption of an electronic device tends to increase as the amount of computation increases. A solid-state relay is used in order to achieve power gating of a functional module or an integrated circuit for the purpose of a reduction in the power consumption of an electronic device. The resistance value of a switch in a solid-state relay is larger than that in a reed relay or the like with a mechanical contact; therefore, the switch serves as a resistance component, resulting in a problem of power consumption. In particular, in the case where the switch is used for controlling conduction or non-conduction of a wiring that supplies a power supply potential to the functional module or the integrated circuit, the resistance component of the switch might cause power loss.

Reductions in a mounting area and weight are necessary for the solid-state relay used in an electronic device. In particular, in the case where high power is handled in a mobile device, a robot, a car-mounted device, or the like, there is a difficulty in using a reed relay or the like because of limitation on the mounting area or the weight. Therefore, a low-resistance switch capable of supplying high power and reductions in size and weight are necessary for the solid-state relay.

The solid-state relay includes the light-emitting element in the first circuit and the light-receiving element in the second circuit. The light-emitting element is formed through a process different from that of the light-receiving element. Accordingly, the first circuit including the light-emitting element and the second circuit including the light-receiving element are stored in one housing in the solid-state relay. That is, since the first circuit and the second circuit formed through different processes are used, bonding, molding processing, or the like is necessary, which causes a problem of an increase in the manufacturing cost.

An object of one embodiment of the present invention is to provide a solid-state relay with a novel structure. Another object of one embodiment of the present invention is to provide a solid-state relay with favorable electrical characteristics. Another object is to provide a downsized solid-state relay. Another object is to provide a highly reliable solid-state relay.

An object of one embodiment of the present invention is to provide a semiconductor device with a novel structure. Another object of one embodiment of the present invention is to provide a semiconductor device with favorable electrical characteristics. Another object is to provide a downsized semiconductor device. Another object is to provide a highly reliable semiconductor device.

Note that the description of these objects does not preclude the existence of other objects. One embodiment of the present invention does not have to achieve all these objects. Objects other than these can be derived from the description of the specification, the drawings, the claims, and the like.

Means for Solving the Problems

One embodiment of the present invention is a solid-state relay including a first circuit and a second circuit. The first circuit includes a first light-emitting element. The second circuit includes a first light-receiving element, a memory, and a first switch. The first switch and the first light-emitting element are formed using a first semiconductor layer. The first semiconductor layer includes gallium. On or off of the first light-emitting element is controlled by a first signal supplied to the first circuit. Light emitted by the first light-emitting element by the first signal is supplied to the first light-receiving element, and the first light-receiving element generates first data by converting the light into voltage. The first data is stored in the memory, and conduction or non-conduction of the first switch is controlled by the first data in the solid-state relay.

One embodiment of the present invention is a solid-state relay including a first circuit and a second circuit. The first circuit includes a first light-emitting element and a second light-emitting element. The second circuit includes a first light-receiving element, a second light-receiving element, a memory, and a first switch. The first switch, the first light-emitting element, and the second light-emitting element are formed using a first semiconductor layer. The first semiconductor layer includes gallium. On or off of the first light-emitting element is controlled by a first signal supplied to the first circuit. On or off of the second light-emitting element is controlled by a second signal supplied to the first circuit. Light emitted by the first light-emitting element by the first signal is supplied to the first light-receiving element, and the first light-receiving element generates first data by converting the light into voltage. The first data is stored in the memory via a second switch, and conduction or non-conduction of the first switch is controlled by the first data. The first switch is controlled so as to be brought into conduction by the first data stored in the memory. Light emitted by the second light-emitting element by the second signal is supplied to the second light-receiving element, and the second light-receiving element generates second data by converting the light into voltage. The first data stored in the memory is initialized by the second data. The first switch is controlled so as to be brought into non-conduction when the first data stored in the memory is initialized in the solid-state relay.

In the above, the memory includes the second switch, a third switch, and a capacitor. The second switch and the third switch are formed above the first switch by using a second semiconductor layer. The capacitor is formed above the second semiconductor layer. The memory stores the first data in the capacitor by controlling the second switch, and the third switch is brought into an on-state by the second data. The first data stored in the capacitor is preferably initialized when the third switch is brought into the on-state.

In the above, it is preferable that the first semiconductor layer include nitrogen and the second semiconductor layer include indium, zinc, and oxygen.

In the above, it is preferable that the first semiconductor layer include nitrogen or oxygen and the second semiconductor layer include indium, zinc, and oxygen.

In the solid-state relay, it is preferable that part of the first light-receiving element be placed in a position overlapping with the first light-emitting element.

In the above, the solid-state solid includes a fluorescent substance. The fluorescent substance is placed between the first light-emitting element and the first light-receiving element. In the solid-state relay, the fluorescent substance preferably converts a wavelength of light emitted by the first light-emitting element into a wavelength longer than the wavelength of the light emitted by the first light-emitting element.

In the above, the first light-receiving element includes an active layer. The active layer preferably includes an organic compound in the solid-state relay.

One embodiment of the present invention is a solid-state relay including a first circuit and a second circuit. The first circuit includes a first light-emitting element, a second light-emitting element, a first terminal, a second terminal, and a third terminal. The second circuit includes a first transistor, a second transistor, a third transistor, a first light-receiving element, a second light-receiving element, a capacitor, a fourth terminal, and a fifth terminal. The first terminal is electrically connected to one electrode of the first light-emitting element, the third terminal is electrically connected to one electrode of the second light-emitting element, the second terminal is electrically connected to the other electrode of the first light-emitting element and the other electrode of the second light-emitting element, a gate of the first transistor is electrically connected to one of a source and a drain of the second transistor, one of a source and a drain of the third transistor, and one electrode of the capacitor. The other of the source and the drain of the second transistor is electrically connected to a gate of the second transistor and one electrode of the first light-receiving element. A gate of the third transistor is electrically connected to one electrode of the second light-receiving element. The fourth terminal is electrically connected to one of a source and a drain of the first transistor. The fifth terminal is electrically connected to the other of the source and the drain of the first transistor, the other of the source and the drain of the third transistor, the other electrode of the capacitor, the other electrode of the first light-receiving element, and the other electrode of the second light-receiving element. Light emitted by the first light-emitting element is supplied to the first light-receiving element, and light emitted by the second light-emitting element is supplied to the second light-receiving element. In the solid-state relay, a wiring electrically connecting the gate of the first transistor, the one of the source and the drain of the second transistor, and the one of the source and the drain of the third transistor is positioned to block light so that the light emitted by the first light-emitting element does not enter the second light-receiving element and is positioned to block light so that the light emitted by the second light-emitting element does not enter the first light-receiving element.

In the above, one embodiment of the present invention is a semiconductor device including the solid-state relay and a processor. A first signal or a second signal is supplied to the first circuit by the processor. On or off of the first light-emitting element is controlled by the first signal supplied to the first circuit. On or off of the second light-emitting element is controlled by the second signal supplied to the first circuit. Light emitted by the first light-emitting element by the first signal is supplied to the first light-receiving element. The first light-receiving element generates first data by converting the light into voltage, and the first data is stored in the capacitor via the second transistor. The first transistor is controlled so as to be brought into conduction by the first data stored in the capacitor. Light emitted by the second light-emitting element by the second signal is supplied to the second light-receiving element. The second light-receiving element generates second data by converting the light into voltage, and the first data stored in the capacitor is initialized when the third transistor is brought into an on-state by the second data. The first transistor is controlled so as to be brought into non-conduction when the first data stored in the capacitor is initialized. In the semiconductor device, a voltage width of the fourth terminal supplied with the fifth terminal as a reference is larger than a voltage width of the first signal supplied by the processor.

Effect of the Invention

According to one embodiment of the present invention, a solid-state relay with a novel structure can be provided. According to another embodiment of the present invention, a solid-state relay with favorable electrical characteristics can be provided. Alternatively, a downsized solid-state relay can be provided. Alternatively, a highly reliable solid-state relay can be provided.

According to one embodiment of the present invention, a semiconductor device having a novel structure can be provided. According to one embodiment of the present invention, a semiconductor device having favorable electrical characteristics can be provided. Alternatively, a downsized semiconductor device can be provided. Alternatively, a highly reliable semiconductor device can be provided.

Note that the effects of one embodiment of the present invention are not limited to the effects listed above. The effects listed above do not preclude the existence of other effects. Note that the other effects are effects that are not described in this section and will be described below. The other effects not described in this section will be apparent from the description of the specification, the drawings, and the like and can be derived as appropriate from the description by those skilled in the art. One embodiment of the present invention has at least one effect of the effects listed above and/or the other effects. Accordingly, depending on the case, one embodiment of the present invention does not have the effects listed above in some cases.

BRIEF DESCRIPTION OF THE DRAWINGS

FIG. 9A is a diagram illustrating the classification of crystal structures of IGZO.
FIG. 9B is a diagram showing an XRD spectrum of quartz glass.
FIG. 9C is a diagram showing an XRD spectrum of crystalline IGZO.
FIG. 9D is a diagram showing a nanobeam electron diffraction pattern of crystalline IGZO.

MODE FOR CARRYING OUT THE INVENTION

Figure 1:
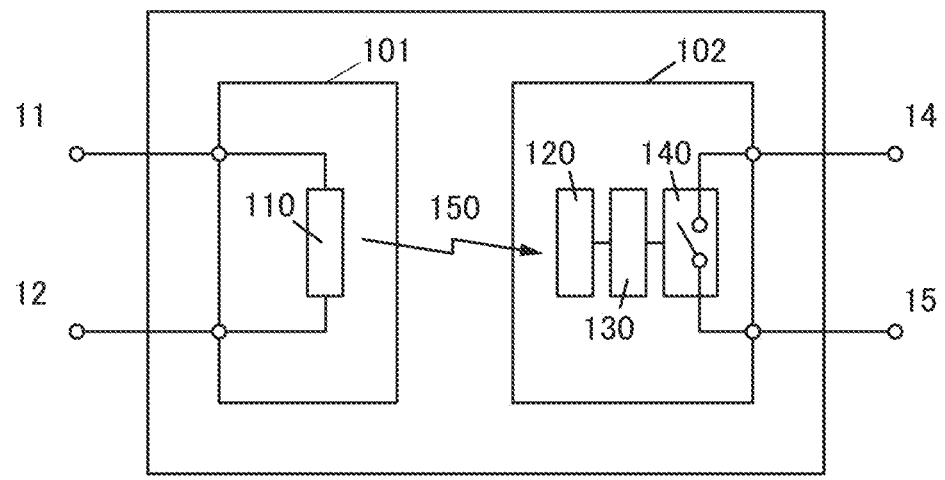
FIG. 1 is a block diagram illustrating a solid-state relay.

Embodiments are described in detail with reference to the drawings. Note that the present invention is not limited to the following description, and it will be readily understood by those skilled in the art that modes and details of the present invention can be modified in various ways without departing from the spirit and scope. Therefore, the present invention should not be interpreted as being limited to the descriptions of embodiments below. Note that in structures of the present invention described below, the same reference numerals are used in common for the same portions or portions having similar functions in different drawings, and a repeated description thereof is omitted.

The position, size, range, and the like of each component illustrated in the drawings and the like are not accurately represented in some cases to facilitate understanding of the invention. Therefore, the disclosed invention is not necessarily limited to the position, size, range, or the like disclosed in the drawings and the like. For example, in the actual manufacturing process, a resist mask or the like might be unintentionally reduced in size by treatment such as etching, which is not illustrated in some cases for easy understanding.

In a top view (also referred to as a "plan view"), a perspective view, or the like, some components might be omitted for easy understanding of the drawings.

In this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example. Moreover, in describing a circuit, a "wiring" includes a resistor in some cases.

In this specification and the like, the resistance value of a "resistor" is sometimes determined depending on the length of a wiring. Alternatively, the resistor can be formed by connecting the wiring through a contact to a conductive layer whose resistivity is different from that of the conductive layer used as the wiring. Alternatively, the resistance value is sometimes determined by impurity doping in a semiconductor layer.

In this specification and the like, a "terminal" in an electric circuit refers to a portion where current is input or charge voltage is input or output, and/or a signal is received or transmitted. Accordingly, part of a wiring or an electrode functions as a terminal in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B.

Functions of a source and a drain are interchanged with each other depending on operation conditions, for example, when a transistor of different polarity is employed or when the direction of current flow is changed in circuit operation; therefore, it is difficult to define which is the source or the drain. Thus, the terms "source" and "drain" can be interchanged with each other in this specification.

In this specification and the like, the expression "electrically connected" includes the case where components are directly connected to each other and the case where components are connected through an "object having any electric function". Here, there is no particular limitation on the "object having any electric function" as long as electric signals can be transmitted and received between components that are connected through the object. Thus, even when the expression "electrically connected" is used, there is a case where no physical connection is made and a wiring just extends in an actual circuit. Furthermore, the expression "directly connected" includes the case where wirings formed of different conductive layers are formed as one wiring through a contact.

In this specification and the like, "parallel" indicates a state where two straight lines are placed at an angle of greater than or equal to −10° and less than or equal to 10°, for example. Thus, the case where the angle is greater than or equal to −5° and less than or equal to 5° is also included. Furthermore, the terms "perpendicular" and "orthogonal" indicate a state where two straight lines are placed at an angle of greater than or equal to 80° and less than or equal to 100°, for example. Thus, the case where the angle is greater than or equal to 85° and less than or equal to 95° is also included.

In this specification and the like, the terms "identical", "same", "equal", "uniform", and the like used in describing calculation values and measurement values allow for a margin of error of ±20% unless otherwise specified.

Furthermore, in this specification, in the case where an etching treatment is performed after a resist mask is formed, the resist mask is removed after the etching treatment, unless otherwise specified.

A voltage refers to a potential difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Note that a "semiconductor" has characteristics of an "insulator" when the conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote some kind of sequential order or priority, such as the order of steps or the stacking order. A term without an ordinal number in this specification and the like might be provided with an ordinal number in the scope of claims in order to avoid confusion among components. Furthermore, a term with an ordinal number in this specification and the like might be provided with a different ordinal number in the scope of claims. Furthermore, even when a term is provided with an ordinal number in this specification and the like, the ordinal number might be omitted in the scope of claims and the like.

Note that in this specification and the like, an "on state" of a transistor refers to a state in which a source and a drain of the transistor are regarded as being electrically short-circuited (also referred to as a "conduction state"). Furthermore, an "off state" of a transistor refers to a state in which a source and a drain of the transistor are regarded as being electrically disconnected (also referred to as a "non-conduction state").

In this specification and the like, in some cases, "on-state current" means a current that flows between a source and a drain when a transistor is in an on state. Furthermore, in some cases, "off-state current" means a current that flows between a source and a drain when a transistor is in an off state.

In this specification and the like, a high power supply potential VDD (hereinafter also simply referred to as "VDD" or an "H potential") is a power supply potential higher than a low power supply potential VSS. The low power supply potential VSS (hereinafter also simply referred to as "VSS" or an "L potential") is a power supply potential lower than the high power supply potential VDD. In addition, a ground potential can be used as VDD or VSS. For example, in the case where VDD is the ground potential, VSS is a potential lower than the ground potential, and in the case where VSS is the ground potential, VDD is a potential higher than the ground potential.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

Embodiment 1

In this embodiment, a solid-state relay of one embodiment of the present invention will be described. First, relays are briefly described. Relays include a contact relay with a mechanical contact (hereinafter referred to as a movable contact) and a non-contact relay. Both relays include a first circuit and a second circuit. The second circuit includes a first terminal, a second terminal, and a switch. The switch included in the second circuit is controlled by a first signal supplied to the first circuit. The switch can control conduction or non-conduction between the first terminal and the second terminal. Note that a transistor, a diode, or the like can be used as the switch. The switch can control a DC signal or an AC signal.

Next, a relay with a movable contact is described in detail. For example, a reed relay with a movable contact generates electromagnetic force when a signal is supplied to an electromagnetic coil included in the first circuit. Conduction or non-conduction of the switch included in the second circuit is controlled by voltage generated by the electromagnetic force. Note that the reed relay has a problem in operation, called chattering. Chattering is a phenomenon in which a mechanical vibration occurs when a movable contact is in a contact state and conduction and non-conduction of the movable contact are repeated at high speed. Therefore, chattering is considered as one of factors that cause malfunction of electronic devices. In the case where conduction or non-conduction of a wiring supplying a power supply potential is controlled by the reed relay, there is a problem that timing design in consideration of a period in which chattering occurs or addition of an electronic component such as a low-pass filter is necessary.

Note that the reed relay can control a large amount of current of, for example, one ampere or larger, depending on the kind, the structure, or the like of an electrode of the movable contact. However, when high power is handled using the reed relay, a spark or the like might occur at the time of contact with the movable contact. Accordingly, for example, contact failure due to oxidation of a surface of the movable contact or a short circuit due to fusion of adjacent movable contacts or the like might occur in the movable contact. In addition, the reed relay is difficult to downsize because it requires a component such as a movable contact or an electromagnetic coil. Therefore, in the case of using a reed relay, an electronic device such as a mobile device, a robot, or a car-mounted device is difficult to downsize.

In particular, control of higher voltage or larger current is required for an electronic device such as a robot or a car-mounted device. For example, a power semiconductor is known as an element capable of controlling high voltage or large current. Typical power semiconductors are, for example, an IGBT (Insulated Gate Bipolar Transistor) and an IEGT (Injection Enhanced Gate Transistor).

Next, a solid-state relay of one embodiment of the present invention is described. Instead of an electromagnetic coil, the solid-state relay controls conduction or non-conduction of the switch using a first light-emitting element and a first light-receiving element. An electroluminescent element such as a light-emitting diode (LED) or an OLED (Organic Light Emitting Diode) can be used as the first light-emitting element. An organic optical sensor, a photodiode, or a phototransistor can be used as the first light-receiving element. Therefore, the solid-state relay can be rephrased as a non-contact relay. An example of a solid-state relay is a photoMOS relay including a MOSFET (Metal-Oxide-Semiconductor Field-Effect Transistor). Note that in this embodiment, an organic optical sensor is used as the first light-receiving element, for example. The use of an organic optical sensor can reduce a process temperature for forming the first light-receiving element. In the case where a photodiode is used as a first light-receiving sensor, the wavelength range of light that can be detected by the first light-receiving element can be set to a wide range from visible-light wavelengths to infrared wavelengths.

The solid-state relay is further described in detail. The solid-state relay includes the first light-emitting element in the first circuit, and includes the first light-receiving element, the switch, a memory, the first terminal, and the second terminal in the second circuit. On or off of the first light-emitting element is controlled by the first signal supplied to the first circuit. Light emitted by the first light-emitting element by the first signal is supplied to the first light-receiving element, and the first light-receiving element generates first data by converting the light into voltage. The first data is stored in the memory, and as for a first switch, conduction or non-conduction between the first terminal and the second terminal is controlled by the first data. Note that the switch can be rephrased as the first switch in order that it can be distinguished from a second switch or a third switch described in the following description.

Since a semiconductor element such as a transistor is used as the first switch, the solid-state relay is more influenced by a resistance component (e.g., a conductance component of the transistor) than a reed relay or the like with a mechanical contact. That is, the first switch may cause power loss in the solid-state relay. Thus, in the case where a functional module, an integrated circuit, or the like is subjected to power gating control, the first switch that causes less power loss like a power semiconductor is necessary at the time when the solid-state relay is in a conduction state. Note that when a transistor is used as the first switch, a countermeasure for chattering is not required for the solid-state relay. Accordingly, the solid-state relay can be operated at higher speed than a reed relay or the like. In addition, the solid-state relay is favorably downsized because of not having a movable contact. Moreover, oxidation, fusion, and the like of a movable contact, which are generated in a reed relay, do not occur in the solid-state relay; therefore, the solid-state relay has excellent reliability.

Latest electronic devices have higher power consumption as the amount of computation is increased in functional modules, integrated circuits, or the like, owing to hardware implementation of AI (Artificial Intelligence), for example. A functional module, an integrated circuit, or the like in a robot or the like requires high power in order to control a motor. Accordingly, in the case where power gating is controlled in the functional module, the integrated circuit, or the like, small size is required. Furthermore, in a period during which the solid-state relay is in a conduction state, the first switch that can handle high power like a power semiconductor is necessary. In addition, in a period during which the solid-state relay is in a non-conduction state, operation needs to be maintained even when the first signal is not continuously supplied to the first circuit.

In one embodiment of the present invention, the second circuit includes the memory. The memory includes a second switch and a capacitor. The first data detected by the first light-receiving element is stored in the memory via the second switch. Thus, conduction or non-conduction of the first switch is controlled by the first data stored in the memory.

In the above-described solid-state relay, the first circuit further includes a second light-emitting element, the second circuit further includes a second light-receiving element, and the memory included in the second circuit further includes a third switch. Note that the first light-emitting element and the second light-emitting element are sometimes referred to as light-emitting elements without the ordinal numbers, for simplicity of the following description. The first light-receiving element and the second light-receiving element are sometimes referred to as light-receiving elements without the ordinal numbers.

Next, operation of the solid-state relay with the above-described structure will be described. The first signal supplied to the first circuit controls on or off of the first light-emitting element. A second signal supplied to the first circuit controls on or off of the second light-emitting element. The first data detected by the first light-receiving element is stored in the memory. The first switch is controlled so as to be brought into conduction by the first data stored in the memory. The first data stored in the memory is initialized by second data that has been converted into voltage by the second light-receiving element. The first switch is controlled so as to be brought into non-conduction by the initialization of the memory.

That is, in the solid-state relay, conduction or non-conduction of the first switch can be controlled by the first signal or the second signal supplied to the first circuit. In other words, the first signal or the second signal can switch the conduction and non-conduction of the first switch at arbitrary time. The conduction and non-conduction of the first switch can be switched at high speed when the first signal is controlled to partly overlap with the second signal as compared to the case where the first signal and the second signal are supplied complementarily.

Next, the first to third switches will be described in detail. In the following description, the first to third switches are referred to as first to third transistors.

The first transistor is preferably capable of handling high voltage or large current. For example, an IGBT, a MESFET, or the like can be used as the first transistor. Note that in the case where an IGBT is used as the first transistor, a source terminal corresponds to an emitter terminal and a drain terminal corresponds to a collector terminal. Alternatively, a transistor including silicon, germanium, a compound semiconductor, or an oxide semiconductor in a semiconductor layer may be used as the first transistor. In the case of a solid-state relay that controls high power, a transistor including a compound semiconductor or an oxide semiconductor is suitable as the first transistor because such a transistor has high withstand voltage and allows large current to flow.

The first transistor includes a first semiconductor layer in one embodiment of the present invention. For example, a compound semiconductor containing gallium nitride (GaN) or silicon nitride (SiC), which is a semiconductor material having a wider band gap than a silicon semiconductor and has lower intrinsic carrier density than silicon, or an oxide semiconductor containing gallium oxide or the like can be used for the first semiconductor layer.

As an example, GaN, which is one of compound semiconductors, can be generated in such a manner that a low-temperature buffer layer is provided over, for example, a sapphire substrate to make single crystal GaN epitaxially grow over the sapphire substrate. Note that an SOI (Silicon On Insulator) substrate or a silicon substrate may be used instead of the sapphire substrate.

Note that the compound semiconductor using nitride may be selected from silicon nitride, aluminum nitride, zirconium nitride, titanium nitride, zinc nitride, magnesium nitride, gallium nitride, tantalum nitride, niobium nitride, bismuth nitride, yttrium nitride, iridium nitride, indium nitride, tin nitride, nickel nitride, hafnium nitride, and the like.

The oxide semiconductor has an advantage of high mass productivity because it can be formed by a chemical vapor deposition method, a sputtering method, or a wet process. Furthermore, the oxide semiconductor can be deposited even at room temperature; thus, the oxide semiconductor can be deposited over a glass substrate or over an integrated circuit using silicon. In addition, the oxide semiconductor can be used for a larger substrate. Accordingly, among the above-described wide-gap semiconductors, the oxide semiconductor particularly has an advantage of high mass productivity. Furthermore, in the case where an oxide semiconductor with high crystallinity is to be obtained in order to improve the property of a transistor (e.g., field-effect mobility), the oxide semiconductor with crystallinity can be easily obtained by heat treatment at 250° C. to 800° C.

Note that the oxide semiconductor may be selected from silicon oxide, aluminum oxide, zirconium oxide, titanium oxide, zinc oxide, magnesium oxide, gallium oxide, tantalum oxide, niobium oxide, bismuth oxide, yttrium oxide, iridium oxide, indium oxide, tin oxide, nickel oxide, hafnium oxide, ITO (indium tin oxide), IZO (indium zinc oxide (registered trademark)), zinc oxide to which aluminum is added (Aluminum Zinc Oxide), zinc oxide to which gallium is added (Galium Zinc Oxide), and the like.

In addition, one or more of aluminum, yttrium, copper, vanadium, cadmium, beryllium, boron, arsenic, phosphorus, silicon, titanium, iron, nickel, zinc, tin, germanium, zirconium, molybdenum, lanthanum, cerium, neodymium, hafnium, tantalum, tungsten, magnesium, and the like may be contained in the oxide semiconductor or the compound semiconductor.

Next, the second or third transistor will be described. A transistor with a low off-state current is preferably used as the second or third transistor. The second or third transistor includes a second semiconductor layer. When a transistor with a low off-state current is used as the second or third transistor, the first data can be retained in a period during which power gating of the functional module, the integrated circuit, or the like is performed. Accordingly, power for retaining on or off of the first light-emitting element can be reduced. For example, in the case where the semiconductor layer of the first transistor is an oxide semiconductor and the semiconductor layer of the second or third transistor is an oxide semiconductor, the second semiconductor layer preferably includes a different oxide semiconductor from the first semiconductor layer.

Note that the oxide semiconductor used for the second semiconductor layer contains at least indium (In). In particular, In and zinc (Zn) are preferably contained. As a stabilizer for reducing variation in electrical characteristics of the transistor including the oxide semiconductor film, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

Note that, for example, an In—Ga—Zn-based oxide means an oxide containing In, Ga, and Zn and there is no particular limitation on the ratio of In, Ga, and Zn. In addition, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Moreover, the In—Ga—Zn-based oxide has high mobility.

A transistor including an oxide semiconductor (which may be rephrased as a metal oxide) in the second semiconductor layer is referred to as an OS transistor.

In the OS transistor, the semiconductor layer has a large energy gap, and thus the OS transistor can have an extremely low off-state current of several yA/μm (current per micrometer of a channel width). An OS transistor has features such that impact ionization, an avalanche breakdown, a short-channel effect, or the like does not occur, which are different from those of a Si transistor. Thus, the use of an OS transistor enables formation of a highly reliable circuit. Moreover, variations in electrical characteristics due to crystallinity unevenness, which are caused in Si transistors, are less likely to occur in OS transistors.

In the case where the oxide semiconductor contained in the second semiconductor layer is an In-M-Zn-based oxide, it is preferable that the atomic ratio of metal elements in a sputtering target used for depositing the In-M-Zn oxide satisfy In M and Zn M. The atomic ratio of metal elements in such a sputtering target is preferably, for example, In:M:

Zn=1:1:1, In:M:Zn=1:1:1.2, In:M:Zn=3:1:2, In:M:Zn=4:2:3, In:M:Zn=4:2:4.1, In:M:Zn=5:1:3, In:M:Zn=5:1:6, or In:M:Zn=5:1:7, InM:Zn=5:1:8, or In:M:Zn=10:1:3. In the case where the oxide semiconductor contained in the semiconductor layer is an In—Zn oxide, it is preferable that the atomic ratio of metal elements in a sputtering target used for depositing the In—Zn oxide satisfy In ≥Zn. As the atomic ratio of metal elements in such a sputtering target, In:Zn=1:1, In:Zn=2:1, In:Zn=5:1, In:Zn=5:3, In:Zn=10:1, In:Zn=10:3, and the like are preferable.

An oxide semiconductor with low carrier concentration is used for the semiconductor layer. For example, as the semiconductor layer, an oxide semiconductor whose carrier concentration is lower than or equal to $1\times10^{17}/cm^3$, preferably lower than or equal to $1\times10^{15}/cm^3$, more preferably lower than or equal to $1\times10^{13}/cm^3$, still more preferably lower than or equal to $1\times10^{11}/cm^3$, even more preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has a low density of defect states and can thus be regarded as an oxide semiconductor having stable characteristics.

Note that, examples of a material for the semiconductor layer are not limited to those described above, and a material with an appropriate composition may be used in accordance with required semiconductor characteristics and electrical characteristics (e.g., field-effect mobility and threshold voltage) of the transistor. To obtain the required semiconductor characteristics of the transistor, it is preferable that the carrier concentration, the impurity concentration, the defect density, the atomic ratio between a metal element and oxygen, the interatomic distance, the density, and the like of the semiconductor layer be set to appropriate values. Note that an OS transistor will be described in detail in Embodiment 2.

The light-emitting elements are preferably formed using the same first semiconductor layer as the first transistor. When the light-emitting elements include the first semiconductor layer, the first circuit and the second circuit can be formed over the same substrate in the solid-state relay.

The second or third transistor is preferably provided over the first transistor. The first or second light-receiving element is preferably formed over the second or third transistor. The first or second light-receiving element preferably includes an active layer, and the active layer is preferably an organic compound. Note that the active layer included in the first or second light-receiving element can detect light with any one of wavelengths in a wavelength range from the visible-light region to the infrared region. The wavelength range of the light is preferably from 400 nm to 780 nm, further preferably from 380 nm to 1400 nm. Note that the wavelength ranges that can be detected by the first and second light-receiving elements can be limited to their respective wavelength ranges. The wavelength range can be selected depending on a material used for a fluorescent substance, a color filter, or the active layer, which will be described later.

It is preferable that part of the first light-receiving element be placed in a position overlapping with the first light-emitting element, and part of the second light-receiving element be placed in a position overlapping with the second light-emitting element. Accordingly, it is preferable that a channel formation region of the second transistor be shielded from light emitted by the first light-emitting element, by a gate electrode or a back gate electrode of the second transistor. In addition, it is preferable that a channel formation region of the third transistor be shielded from light emitted by the second light-emitting element, by a gate electrode or a back gate electrode of the third transistor. Light is blocked so that the light emitted by the second or third light-emitting element cannot enter the channel formation region of the second or third transistor, whereby generation of leakage current due to light entering the second or third transistor can be inhibited.

A wiring that electrically connects a gate of the first transistor, one of a source and a drain of the second transistor and one of a source and a drain of the third transistor may have a light-shielding function. For example, the first light-receiving element can be placed so that part or the whole of light emitted by the second light-emitting element can be blocked by the wiring. Furthermore, the second light-receiving element can be placed so that part or the whole of light emitted by the first light-emitting element can be blocked by the wiring.

Note that even when electromotive force generated by the second light-receiving element is supplied to the second transistor, part of light emitted by the first light-emitting element can enter the second light-receiving element as long as current does not flow between the source and the drain of the second transistor. Furthermore, even when electromotive force generated by the first light-receiving element is supplied to the first transistor, part of light emitted by the second light-emitting element can enter the first light-receiving element as long as current does not flow between the source and the drain of the first transistor.

The solid-state relay can further include a fluorescent substance. For example, an insulating layer containing a fluorescent substance can be placed between the light-emitting element and the light-receiving element. The fluorescent substance can convert the wavelength of light emitted by the light-emitting element into a wavelength longer than that of the light emitted by the light-emitting element. Specifically, in the case where the light emitted by the light-emitting element is in a shorter wavelength range than a wavelength range that can be detected by the light-receiving element, the fluorescent substance can convert the wavelength range of the light emitted by the light-emitting element into the wavelength range that can be detected by the light-receiving element (light within a wavelength range from the visible-light region to the infrared region). The fluorescent substance can convert the wavelength of the light emitted by the light-emitting element into the wavelength range that can be detected by the light-receiving element. Therefore, the selectivity and the transmissibility of the first signal supplied to the first circuit are improved, so that transmission to the second circuit can be surely performed.

Note that the solid-state relay can include a color filter instead of the insulating layer containing the fluorescent substance. In the case where the wavelength range of light emitted by the light-emitting element is wide, the color filter can transmit light within the wavelength range that can be detected by the light-receiving element. Therefore, the color filter is preferably placed between the light-emitting element and the light-receiving element. For example, when the color filter is placed, the wavelength range of light entering the channel formation regions of the first to third transistors can be limited. With the color filter, leakage current in the first to third transistors, which is generated when light that is out of the wavelength range enters the channel formation regions of the first to third transistors, is not generated, which is preferable.

Note that the channel formation regions of the first to third transistors are preferably shielded from light by the gate or the back gate of the second or third transistor, the wiring connecting the transistors, the fluorescent substance, the color filter, or the like.

Next, the memory included in the second circuit will be described. The memory includes the second or third transistor and the capacitor. In the capacitor, part of the wiring electrically connecting the gate of the first transistor, one of the source and the drain of the second transistor, and one of the source and the drain of the third transistor is used as one electrode of the capacitor. Note that part of a wiring connected to one electrode of the light-receiving element can be used as the other electrode of the capacitor.

As described above, the first circuit and the second circuit are formed over the same substrate, whereby the solid-state relay with a novel structure can be provided. In addition, light emitted by the light-emitting element can be blocked using the gate or the back gate of the transistor, the wiring connecting the transistors, the color filter, the fluorescent substance, or the like. Accordingly, the solid-state relay in which the first signal is isolated from the second signal can be provided. In addition, when an oxide semiconductor or a compound semiconductor is used for the first transistor, a low-loss solid-state relay with favorable electrical characteristics that can be ready for high power can be provided. When the first circuit and the second circuit are formed over the same substrate and the light-receiving element placed in a position overlapping with the light-emitting element is formed, a solid-state relay with a structure suitable for downsizing can be provided. Moreover, with a structure without a movable contact by including the light-emitting element and the light-receiving element, a highly reliable solid-state relay can be provided.

Note that a formation area of the light-emitting element includes an anode electrode and a cathode electrode. A formation area of the light-receiving element is the larger of the areas of the anode electrode and the cathode electrode. Accordingly, an overlap of the light-emitting element with the light-receiving element means that part of the formation area of the light-emitting element and part of the formation area of the light-receiving element overlap with each other.

Next, the solid-state relay of one embodiment of the present invention will be described in detail with reference to drawings.

FIG. 1 is a block diagram illustrating a solid-state relay. A solid-state relay 100 includes a circuit 101, a circuit 102, a terminal 11, a terminal 12, a terminal 14, and a terminal 15. The circuit 101 includes a lighting circuit 110. The lighting circuit 110 includes a light-emitting element. The circuit 102 includes a detection circuit 120, a memory 130, and a switch circuit 140.

The terminal 11 is electrically connected to one terminal of the lighting circuit 110. The terminal 12 is electrically connected to the other terminal of the lighting circuit 110. The detection circuit 120 is electrically connected to the memory 130. The memory 130 is electrically connected to the switch circuit 140. One terminal of the switch circuit 140 is electrically connected to the terminal 14. The other terminal of the switch circuit 140 is electrically connected to the terminal 15.

When a first signal is supplied to the terminal 11, on or off of the lighting circuit 110 is controlled. For example, when a voltage "H" of the first signal is supplied to the terminal 11 and a voltage "L" of the first signal is supplied to the terminal 12, a positive voltage is applied to the terminal 11 with the terminal 12 as a reference. When a positive voltage is applied to the terminal 11 with the terminal 12 as a reference, the light-emitting element is turned on. Light 150 emitted by the lighting circuit 110 is detected by the detection circuit 120. First data detected by the detection circuit 120 is stored in the memory 130. Thus, conduction or non-conduction of the switch circuit 140 is controlled by the first data stored in the memory 130. That is, the lighting circuit 110 and the detection circuit 120 correspond to a photocoupler, which is one of transmission circuits.

Figure 2:
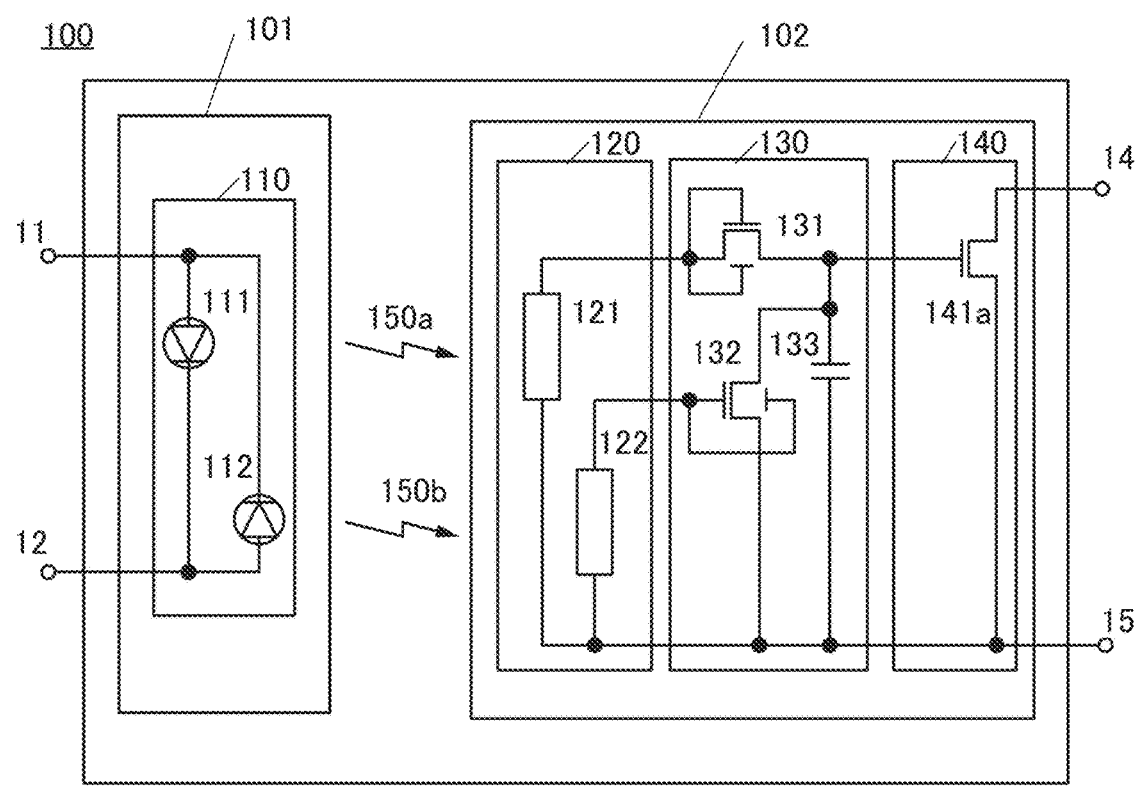
FIG. 2 is a circuit diagram illustrating a solid-state relay.

FIG. 2 is a circuit diagram illustrating the solid-state relay 100 illustrated in FIG. 1 in detail. The lighting circuit 110 includes a light-emitting element 111 and a light-emitting element 112. The detection circuit 120 includes a light-receiving element 121 and a light-receiving element 122; the memory 130 includes a second switch, a third switch, and a capacitor 133; and the switch circuit 140 includes a first switch. Hereinafter, the first switch, the second switch, and the third switch are rephrased as a transistor 141a, a transistor 131, and a transistor 132, respectively.

The terminal 11 is electrically connected to one electrode of the light-emitting element 111, and the terminal 12 is electrically connected to the other electrode of the light-emitting element 111. The terminal 12 is electrically connected to one electrode of the light-emitting element 112, and the terminal 11 is electrically connected to the other electrode of the light-emitting element 112.

A gate of the transistor 141a is electrically connected to one of a source and a drain of the transistor 131, one of a source and a drain of the transistor 132, and one electrode of the capacitor 133. The other of the source and the drain of the transistor 132 is electrically connected to a gate of the transistor 132 and one electrode of the light-receiving element 121. The gate of the transistor 132 is electrically connected to one electrode of the light-receiving element 122. The terminal 14 is electrically connected to one of a source and a drain of the transistor 141a. The terminal 15 is electrically connected to the other of the source and the drain of the transistor 141a, the other of the source and the drain of the transistor 132, the other electrode of the capacitor 133, the other electrode of the light-receiving element 121, and the other electrode of the light-receiving element 122.

Light 150a emitted by the light-emitting element 111 is supplied to the light-receiving element 121, and light 150b emitted by the light-emitting element 112 is supplied to the light-receiving element 122. Note that a wiring electrically connecting the gate of the transistor 141a, the one of the source and the drain of the transistor 131, and the one of the source and the drain of the transistor 132 is placed to block light so that the light 150a emitted by the light-emitting element 111 does not enter the light-receiving element 122 and is placed to block light so that the light 150b emitted by the light-emitting element 112 does not enter the light-receiving element 121.

A signal that has a complementary relationship with the first signal supplied to the terminal 11 is preferably supplied to the terminal 12. For example, in the period during which a voltage "H" is supplied to the terminal 11, a voltage "L" is supplied to the terminal 12. In a period during which a voltage "L" is supplied to the terminal 11, a voltage "H" is supplied to the terminal 12. That is, an inverted signal of the signal supplied to the terminal 12 is supplied to the terminal 11.

Accordingly, the light-emitting element 111 emits light in a period during which a voltage "H" is supplied to the one electrode of the light-emitting element 111 and a voltage "L" is supplied to the other electrode of the light-emitting element 111. Specifically, since the signal having a complementary relationship with the signal supplied to the terminal 12 is supplied to the terminal 11, the light-emitting element 112 is off in a period during which the light-emitting element 111 is on, and the light-emitting element 111 is off in a period during which the light-emitting element 112 is on. Thus, conduction or non-conduction of the solid-state relay can be controlled by one signal.

The light-receiving element 121 detects light emitted by the light-emitting element 111. The light-receiving element 121 generates electromotive force at both ends of the light-receiving element 121 by detecting the light. When the electromotive force is higher than the threshold voltage of the transistor 131, the first data is stored in the capacitor 133 through the transistor 131. In other words, a voltage "H" that is the first signal supplied to the terminal 11 is stored in the capacitor 133. The voltage "H" stored in the capacitor 133 can bring the transistor 141a into conduction. Note that bringing the transistor 141a into conduction can be rephrased as bringing the solid-state relay 100 into conduction.

Note that the signal stored in the capacitor 133 is initialized when the transistor 132 is brought into an on state by a voltage "H" supplied to the terminal 12. That is, the signal stored in the capacitor 133 can be initialized by the transistor 132 to bring the transistor 141a into non-conduction. Note that bringing the transistor 141a into non-conduction can be rephrased as bringing the solid-state relay 100 into non-conduction.

Note that in FIG. 2, the gate of the transistor 131 and the other of the source and the drain of the transistor 131 are electrically connected to form a diode connection. With the formation of the diode connection of the transistor 131, even when small electromotive force is generated in the light-receiving element 121 owing to reflection light, stray light, or the like of the light-emitting element 112, the transistor 131 is not brought into an on state, and there is no influence on the signal stored in the capacitor 133. That is, the diode-connected transistor 131 functions as a switch.

In addition, even when small electromotive force is generated in the light-receiving element 122 owing to reflection light, stray light, or the like of the light-emitting element 111, the transistor 132 is not brought into an on state, and the signal stored in the capacitor 133 is not initialized.

Each of the transistor 131 and the transistor 132 can include a back gate. The back gate of the transistor 131 has an effect of inhibiting variation in the electrical characteristics of the transistor 131, and the back gate of the transistor 132 has an effect of inhibiting variation in the electrical characteristics of the transistor 132.

Although details will be described with reference to FIG. 5A, the back gate of the transistor 131 can shield a channel formation portion of the transistor 131 from light by reflecting light emitted by the light-emitting element 111 or the light-emitting element 112. In addition, the back gate of the transistor 132 can shield a channel formation portion of the transistor 132 from light by reflecting light emitted by the light-emitting element 112 or the light-emitting element 111. As for the light shielding, it is preferable to completely block the light emitted by the light-emitting element 111 or the light-emitting element 112. Note that the light to be blocked includes light that is emitted by the light-emitting element 111 or the light-emitting element 112 and whose intensity, area, or the like is reduced. For example, the case where light emitted by the light-emitting element 111 attenuates owing to an insulating film provided between the light-emitting element 111 and the light-receiving element 121 is also included. As a different example, the case where the insulating film absorbs light is also included.

The solid-state relay 100 has a period in which the light-emitting element 111 or the light-emitting element 112 is transferred from an on state into an off state or a period in which it is transferred from an off state into an on state. That is, an acquisition time caused from the response time of the light-emitting element, the response time of the light-receiving element, or the charge and discharge time of the capacitor 133 has an influence on the switching speed of the solid-state relay 100.

Figure 3A:
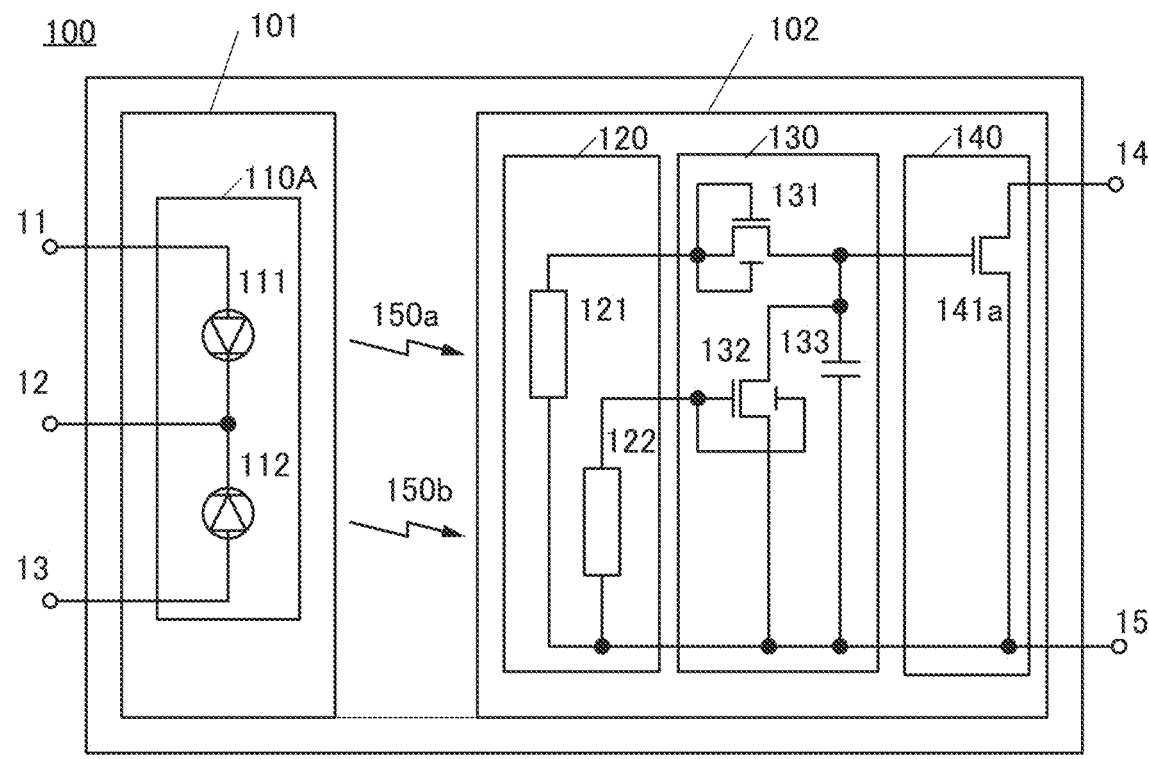
FIG. 3A and FIG. 3B are each a circuit diagram illustrating a solid-state relay.

FIG. 3A is a circuit diagram illustrating the solid-state relay 100 in which the switching speed of the solid-state relay 100 is improved. FIG. 3A differs from FIG. 2 in including a lighting circuit 110A. Note that the lighting circuit 110A includes the light-emitting element 111 and the light-emitting element 112, and the lighting circuit 110A is electrically connected to the terminal 11 to a terminal 13. The terminal 11 is electrically connected to one electrode of the light-emitting element 111. The terminal 13 is electrically connected to one electrode of the light-emitting element 112. The terminal 12 is electrically connected to the other electrode of the light-emitting element 111 and the other electrode of the light-emitting element 112.

A first signal is supplied to the terminal 11, and a second signal is supplied to the terminal 13. Note that a voltage "L" or a third signal is preferably supplied to the terminal 12. For example, in a period during which a voltage "H" is supplied to the terminal 11, a voltage "L" is preferably supplied to the terminal 13. In a period during which a voltage "H" is supplied to the terminal 13, a voltage "L" is preferably supplied to the terminal 11. The voltage "H" is supplied to the capacitor 133 by the first data, and the capacitor 133 is initialized by second data.

Even in the case where the voltage "H" is supplied to the terminal 11, a voltage "H" can be supplied to the terminal 13. In other words, even in a period during which the transistor 141a is on by the first data that has been converted into voltage by the light-receiving element 121, the capacitor 133 can be initialized by the second data that has been converted into voltage by the light-receiving element 122 to bring the transistor 141a into an off state. Therefore, the solid-state relay 100 can provide a high switching speed with the first signal and the second signal.

Note that in the case where a voltage "L" is supplied to the first signal and the second signal, the solid-state relay 100 can retain the conduction or non-conduction state of the transistor 141a owing to the voltage of the first data stored in the capacitor 133. Furthermore, in the case where the transistor 131 or the transistor 132 is an OS transistor, the conduction or non-conduction state of the transistor 141a can be retained for a long period. Therefore, the structure of FIG. 3A is suitable for power gating because favorable switching speed of the solid-state relay 100 and retention of the state for a long period can be achieved.

Figure 3B:
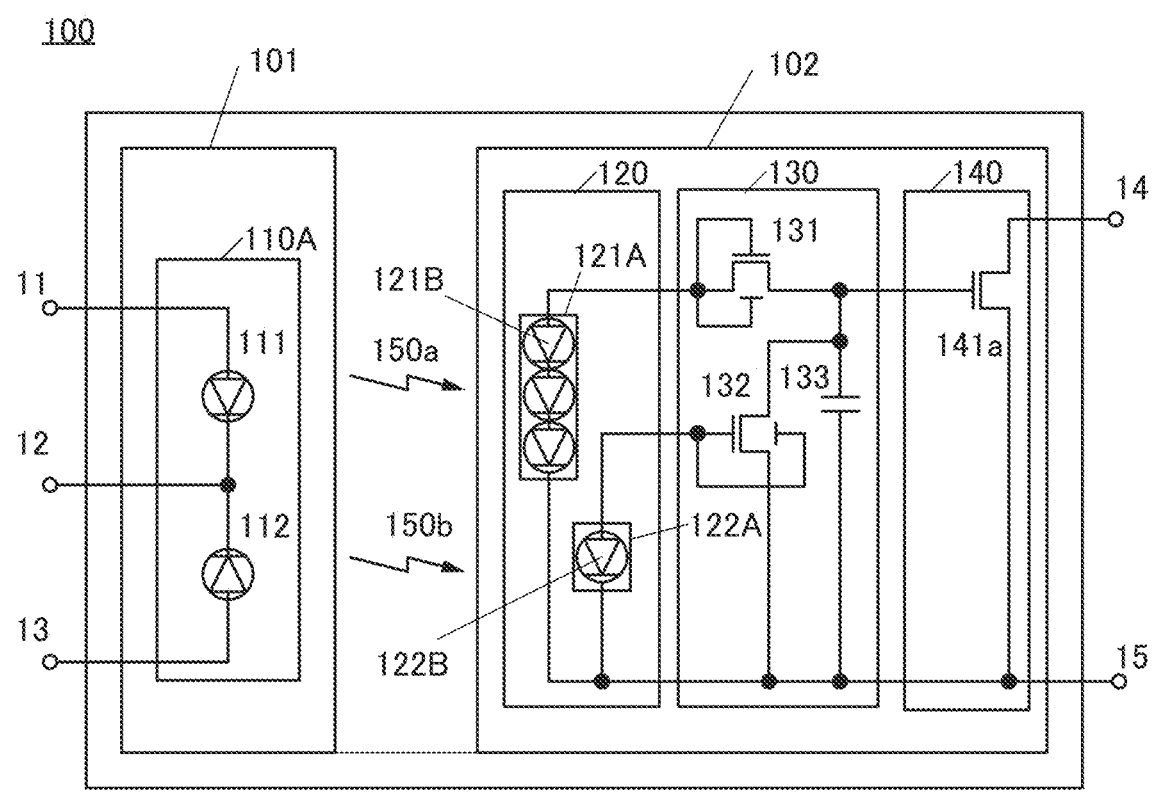

FIG. 3B is a circuit diagram illustrating FIG. 3A in detail. For example, in FIG. 3B, a light-receiving element 121A included in the detection circuit 120 includes the light-receiving element 121A and a light-receiving element 122A includes the light-receiving element 122A.

First, the light-receiving element 121A is described. The light-receiving element 121A includes a plurality of light-receiving elements 121B and the light-receiving elements 121B are connected in series. Note that for example, three light-receiving elements 121B having the same electrical characteristics are connected in series in the light-receiving element 121A in FIG. 3B. Since the light-receiving elements 121B have the same electrical characteristics, electromotive force generated by the light-receiving element 121A is three times as high as the threshold voltage of the light-receiving element 121B. Note that the electromotive force generated by the light-receiving element 121A is preferably a voltage enough to bring the transistor 141a into an on state. In other words, the electromotive force generated by the light-receiving element 121A is preferably higher than the threshold voltage of the transistor 141a. Note that the number of light-receiving elements 121B connected in series is not limited.

Electromotive force generated by the light-receiving element 122A is preferably a voltage enough to bring the transistor 132 into an on state. For example, the light-receiving element 122A includes one light-receiving element 122B in FIG. 3B. In other words, the light-receiving element 122B can control a time for the initialization of the first data retained in the capacitor 133.

Although not illustrated in FIG. 3B, two light-receiving elements 122B having the same electrical characteristics may be connected in parallel in the light-receiving element 122A, for example. Charge can be discharged from the capacitor 133 at a speed twice as high as that in the case where the number of light-receiving elements 122B is one. That is, a time for transferring the solid-state relay 100 from the on state to the off state becomes shorter in accordance with the number of light-receiving elements 122B connected in parallel. In other words, the switching characteristics of the solid-state relay 100 are improved in accordance with the number of light-receiving elements 122B.

Note that in the light-receiving element 121A, the plurality of light-receiving elements 121B may be connected in series or in parallel. In the light-receiving element 122A, a plurality of light-receiving elements 122B may be connected in series or in parallel. The number of light-receiving elements to be connected can be selected in accordance with the switching characteristics of the solid-state relay 100.

Figure 4:
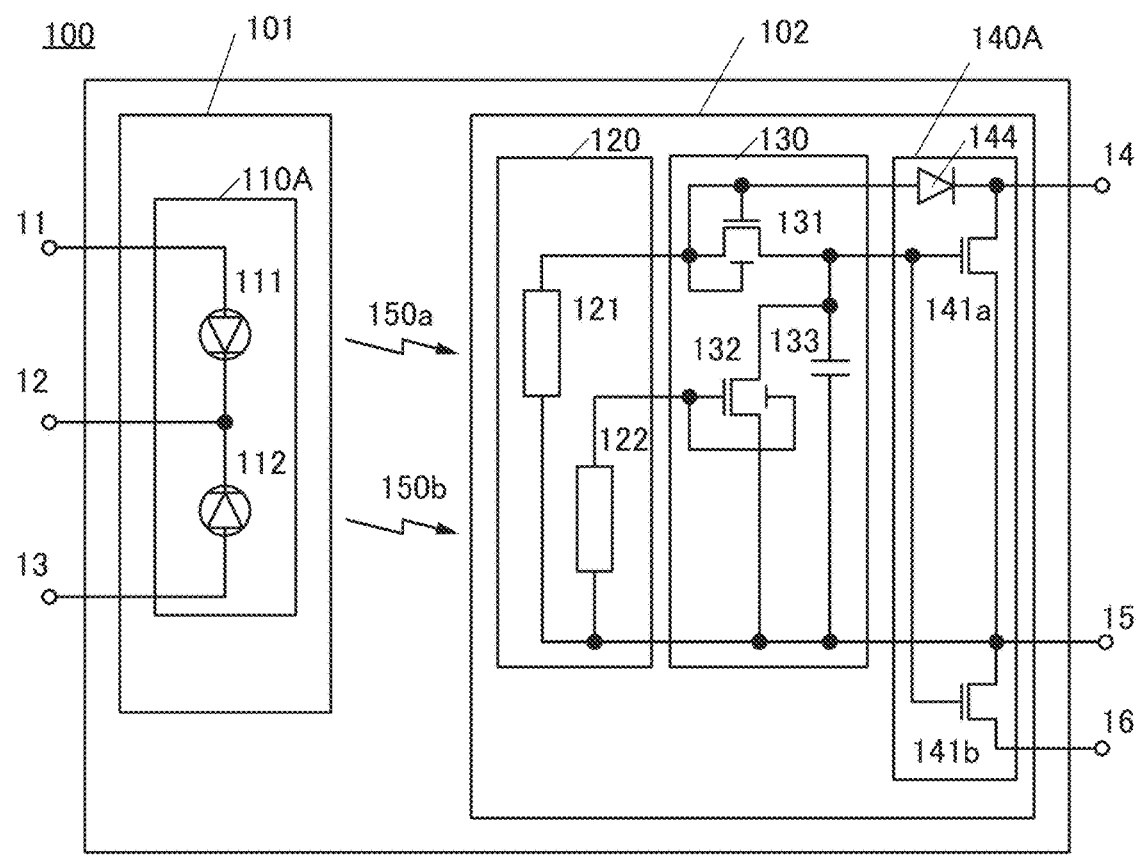
FIG. 4 is a circuit diagram illustrating a solid-state relay.

FIG. 4 is a circuit diagram illustrating a solid-state relay 100 different from that in FIG. 3A. FIG. 4 differs in including a switch circuit 140A. Note that the switch circuit 140A includes the transistor 141a, a transistor 141b, and a diode 144. Furthermore, the switch circuit 140A is electrically connected to the terminal 14 to a terminal 16.

Note that description of the same portions as those for the switch circuit 140 will be omitted because the description of the switch circuit 140 can be referred to. Here, differences of the switch circuit 140A from the switch circuit 140 will be described. A gate of the transistor 141b is electrically connected to the gate of the transistor 141a. One of a source and a drain of the transistor 141b is electrically connected to the terminal 16. The other of the source and the drain of the transistor 141b is electrically connected to the terminal 15.

One of the source and the drain of the transistor 141a is electrically connected to the gate of the transistor 131 via the diode 144. Note that a cathode terminal of the diode 144 is electrically connected to the terminal 14. Note that the diode 144 can be formed using a transistor. The highest voltage of voltages supplied to the solid-state relay 100 is supplied to the terminal 14. Therefore, the diode 144 functions as a protective diode for the solid-state relay 100. For example, in the case where the terminal 14 and the terminal 16 of the solid-state relay 100 are electrically connected in the outside of the solid-state relay 100, the diode 144 also functions as a protective diode for the terminal 16.

Thus, a voltage width of a terminal 4 that is supplied with the terminal 15 as a reference is larger than a voltage width of the first signal supplied to the first circuit. That is, an operating voltage width of a circuit connected to the second circuit can be larger than an operation voltage of a circuit connected to the first circuit. Alternatively, the operating voltage width of the circuit connected to the second circuit can be different from the operation voltage of the circuit to which the first circuit is connected. For example, this applies to the case where large current flows through the transistor 141a of the second circuit although a power supply voltage of the second circuit is lower than a power supply voltage of the first circuit. That is, the solid-state relay 100 has a function of a signal transmission circuit that operates with different power supply voltages.

In the case where the terminal 14 is connected to the terminal 16, the transistor 141b is connected in parallel to the transistor 141a. Accordingly, in the case where the transistor 141a and the transistor 141b have the same electrical characteristics, a resistance component between the terminal 14 and the terminal 16 becomes half, and therefore the amount of current that can be handled by the solid-state relay 100 is doubled. Therefore, power that can be handled by the solid-state relay 100 is doubled, which is preferable. The transistor 141a and the transistor 141b have the same gate capacitance. Therefore, the memory 130 that uses the capacitor 133 and the gate capacitance as a combined capacitance can retain the first data for a longer period. In addition, when the transistor is used as a switch, power loss caused by the transistor can be reduced.

Figure 5A:
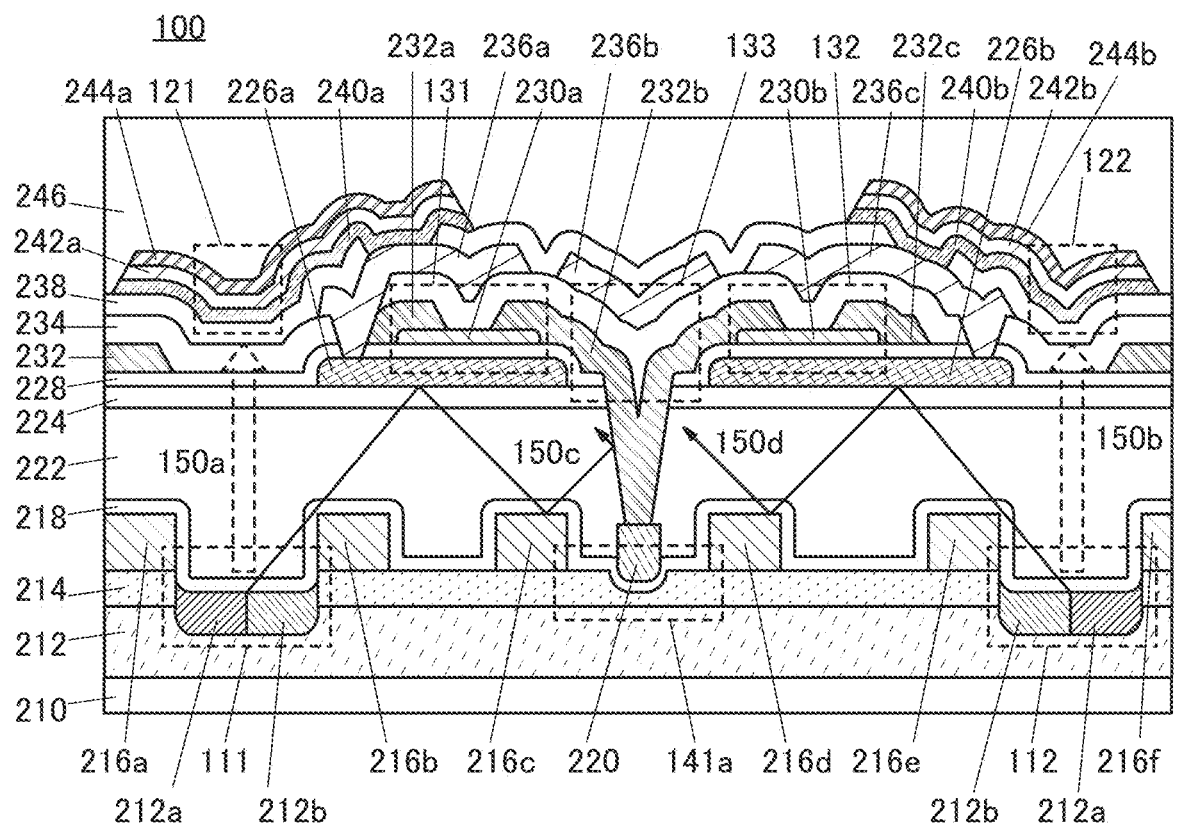
FIG. 5A is a cross-sectional view of a solid-state relay.

Next, FIG. 5 to FIG. 7 are diagrams each illustrating part of a cross-sectional structure of the solid-state relay 100. FIG. 5A illustrates the light-emitting element 111, the light-emitting element 112, the light-receiving element 121 the light-receiving element 122, the transistor 141a, the transistor 131, the transistor 132, and the capacitor 133 in the solid-state relay 100 described in FIG. 3A.

For example, the transistor 141a, the light-emitting element 111, and the light-emitting element 112 are formed using a semiconductor layer formed on a silicon substrate, a sapphire substrate, or an SOI substrate. The semiconductor layer preferably has a crystalline structure containing gallium. As examples of the semiconductor layer containing gallium, gallium nitride (hereinafter, GaN), gallium oxide ($GaO_x$), and the like are given. As another example, silicon nitride (SiC) may be used for the semiconductor layer.

FIG. 5A illustrates the solid-state relay 100 in which GaN is used for a semiconductor layer 212. For example, GaN can be generated in such a manner that a low-temperature buffer layer is provided over a substrate 210 to make single crystal GaN epitaxially grow on the low-temperature buffer layer over the substrate 210. In FIG. 5A, the buffer layer is not illustrated. FIG. 5A illustrates an example in which a sapphire substrate is used as the substrate 210.

When the transistor 141a is formed, a semiconductor layer that is a semiconductor layer 214 epitaxially grown on the semiconductor layer 212 is preferably used. The semiconductor layer 212 is preferably GaN, and the semiconductor layer 214 is preferably AlGaN. For example, aluminum nitride (AlN) is known to have excellent material characteristics such as a band gap (6.2 eV) approximately twice that of GaN, an electrostatic breakdown electric field (12 MV/cm) approximately four times that of GaN, and thermal conductivity (2.9 W/cmK) approximately 1.5 times that of GaN. Therefore, AlN and AlGaN, which is a mixed crystal of AlN and GaN, are preferable as materials for a high-output and high-frequency device. A HEMT (High Electron Mobility Transistor) whose channel formation region is AlGaN can operate with a higher withstand voltage than a HEMT whose channel formation region is GaN. Note that a two-dimensional electron gas (2DEG) is generated at the interface between GaN and AlGaN owing to a polarization effect of GaN and AlGaN. In other words, in a transistor with a HEMT structure, 2DEG is a channel formation region.

The light-emitting element 111 and the light-emitting element 112 can be formed on the semiconductor layer 212 and the semiconductor layer 214. For example, a dopant is added to the semiconductor layer 214 and the semiconductor layer 212, whereby an n-type region 212a or a p-type region 212b is formed. When the n-type region 212a is in contact with the p-type region 212b to form a pn junction, and the light-emitting element 111 or the light-emitting element 112 is formed. As an addition method, an ion doping method, an ion implantation method, a plasma treatment method, or the like is given.

For example, the n-type region 212a is formed by addition of silicon (Si), germanium (Ge) or the like as a dopant. The p-type region 212b is formed by addition of magnesium (Mg), zinc (Zn), cadmium (Cd), beryllium (Be) or the like as a dopant. Note that the n-type region 212a or the p-type region 212b is preferably formed in a region continuous with the semiconductor layer 212 and the semiconductor layer 214. Alternatively, the n-type region 212a or the p-type region 212b may be formed only for the semiconductor layer 212. For example, in the case where the n-type region 212a or the p-type region 212b is formed by an ion doping method, a dopant passes through the semiconductor layer 214 and is added to the semiconductor layer 212 in some cases.

A conductive layer 216a to a conductive layer 216f are provided over the semiconductor layer 214. The conductive layer 216a corresponds to a cathode electrode of the light-emitting element 111, the conductive layer 216b corresponds to an anode electrode of the light-emitting element 111, and the light-emitting element 111 is formed with the n-type region 212a and the p-type region 212b that are formed between the conductive layer 216a and the conductive layer 216b. The conductive layer 216e corresponds to an anode electrode of the light-emitting element 112, the conductive layer 216f corresponds to a cathode electrode of the light-emitting element 112, and the light-emitting element 112 is formed with the n-type region 212a and the p-type region 212b that are formed between the conductive layer 216e and the conductive layer 216f. Note that in the light-emitting element 111 or the light-emitting element 112, the position of the anode electrode or the cathode electrode can be arranged in accordance with the n-type region or the p-type region.

In the case where the conductive layer 216c is one of the source and the drain of the transistor 141a, the conductive layer 216d corresponds to the other of the source and the drain of the transistor 141a. Note that the conductive layer 216c has a function of part of a wiring connected to the terminal 14 and the conductive layer 216d has a function of part of a wiring connected to the terminal 15.

An insulating layer 218 is provided to be sandwiched between a conductive layer 220 and the semiconductor layer 214. Note that the conductive layer 220 and the insulating layer 218 may be rephrased as a gate electrode and a first gate insulating layer, respectively. Silicon oxide, aluminum oxide, hafnium oxide, or the like can be used for the first gate insulating layer. For example, when the first gate insulating layer includes any one of silicon oxide, aluminum oxide, hafnium oxide, or the like, the off-state current of the transistor 141a is reduced. To describe the first gate insulating layer more specifically, the first gate insulating layer is preferably an $SiO_2$ film, an $Al_2O_3$ film, or a $HfO_2$ film. Part of the insulating layer 218 is provided in contact with the top of the n-type region 212a or the p-type region 212b. Part of the insulating layer 218 is provided to cover parts of the conductive layer 216a to the conductive layer 216f.

The transistor 141a preferably has a recessed gate structure. FIG. 5A illustrates an example in which the transistor 141a has a recessed gate structure. When the transistor 141a has a recessed gate structure, the off-state current of the transistor 141a is reduced. The recessed gate structure is formed in such a manner that part of the semiconductor layer 214 that is in a position overlapping with the gate electrode and in which a channel formation region is formed is etched to thin the semiconductor layer 214. The region of the semiconductor layer 214 that is thinned by the etching is referred to as a recessed region. The recessed region has an effect of leading to high threshold voltage (normally off) so that pinch-off of the channel formed by 2DEG can be caused in a depletion layer extending below the gate electrode in the state where no voltage is supplied to the gate electrode (the transistor 141a is in an off state). In addition, large current can flow through a non-recessed region because the concentration of 2DEG is increased.

In the case where the transistor 141a includes the recessed region, a recessed region of the semiconductor layer 214 in the light-emitting element 111 or the light-emitting element 112 can be formed by etching in the same step. When the light-emitting element 111 or the light-emitting element 112 includes the recessed region, an off-state current can be reduced. Thus, turning on the light-emitting element 111 or the light-emitting element 112 due to leakage current or the like can be inhibited.

As a different example, a recessed region is not necessarily provided in the light-emitting element 111 or the light-emitting element 112. When a recessed region is not provided in the light-emitting element 111 or the light-emitting element 112, the responsiveness of the light-emitting element 111 or the light-emitting element 112 is improved. Furthermore, the signal amplitude of the first signal supplied to the circuit 101 can be made small. When the signal amplitude of the first signal is made small, the power consumption of a circuit that controls the circuit 101 can be reduced.

An insulating layer 222 is provided over the insulating layer 218. To reduce surface unevenness of a surface over which the transistor 141a, the light-emitting element 111, or the light-emitting element 112 is formed, it is preferable to perform planarization treatment on the insulating layer 222. The planarization treatment may be, but not particularly limited to, polishing treatment (e.g., chemical mechanical polishing (CMP)) or dry etching treatment.

When the insulating layer 222 is formed using an insulating material with a planarization function, the polishing treatment can be omitted. An organic insulating film is preferable as the insulating layer 222. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. As an alternative to such an organic material, a low-dielectric constant material (a low-k material) or the like can be used. Note that the insulating layer 222 may be formed by stacking a plurality of insulating layers formed of these materials.

An insulating layer 224 is stacked over the insulating layer 222. The insulating layer 224 preferably has a function of inhibiting diffusion of hydrogen contained in the semiconductor layer 212, the semiconductor layer 214, or the like. Therefore, the insulating layer 224 preferably contains at least nitrogen. Although not illustrated in FIG. 5A, an insulating layer 224a can be stacked over the insulating layer 224. It is preferable that the insulating layer 224 contain a larger amount of nitrogen than the insulating layer 224a and the insulating layer 224a contain a larger amount of oxygen than the insulating layer 224. The insulating layer 224a can supply oxygen to a semiconductor layer 230a or a semiconductor layer 230b, which will be described later.

The transistor 131, the transistor 132, the capacitor, the light-receiving element 121, and the light-receiving element 122 are provided over the insulating layer 224. The transistor 131 and the transistor 132 are described first.

A conductive layer 226a is provided over the insulating layer 224. An insulating layer 228 is provided over the conductive layer 226a. The semiconductor layer 230a is placed over the insulating layer 228 to be in a position overlapping with the conductive layer 226a. Note that the semiconductor layer 230a is a semiconductor layer of the transistor 131. A conductive layer 226b is provided over the insulating layer 224. The insulating layer 228 is provided over the conductive layer 226b. The semiconductor layer 230b is placed over the insulating layer 228 to be in a position overlapping with the conductive layer 226b. The semiconductor layer 230b is a semiconductor layer of the transistor 132. Thus, the insulating layer 228 can be rephrased as a second gate insulating layer.

The conductive layer 226a and the conductive layer 226b can be formed using the same material in the same step. The insulating layer 228 is an insulating layer common to the transistor 131 and the transistor 132. The semiconductor layer 230a and the semiconductor layer 230b can be formed using the same material in the same step.

The conductive layer 226a functions as a gate electrode of the transistor 131. The conductive layer 226b functions as a gate electrode of the transistor 131. The conductive layer 226a can prevent light 150c emitted by the light-emitting element 111 from entering the semiconductor layer 230a. The conductive layer 226b can prevent light 150d emitted by the light-emitting element 112 from entering the semiconductor layer 230b.

A conductive layer 232a and a conductive layer 232b are provided over the semiconductor layer 230a, and the conductive layer 232b and a conductive layer 232c are provided over the semiconductor layer 230b. The conductive layer 232a is provided over the insulating layer 228 provided over the conductive layer 226a. The conductive layer 232c is provided over the insulating layer 228 provided over the conductive layer 226b. The conductive layer 232b is provided over the insulating layer 228 provided over the semiconductor layer 230a and the semiconductor layer 230b, and the conductive layer 232b is in contact with the conductive layer 220.

Part of the conductive layer 232b is in contact with each side wall of the insulating layer 222, the insulating layer 224, and the insulating layer 228 that are exposed in a contact hole provided for electrically connecting the conductive layer 232b and the conductive layer 220. An insulating layer 234 is provided over a conductive layer 232 and the conductive layer 232a to the conductive layer 232c. Part of the insulating layer 228 is in contact with parts of the conductive layer 232, the insulating layer 224, and the insulating layer 234.

A conductive layer 236a, a conductive layer 236b, and a conductive layer 236c are provided over the insulating layer 234. Part of the conductive layer 236a is in contact with the conductive layer 232a and part of the conductive layer 226a. Part of the conductive layer 236a is in contact with part of a sidewall of the insulating layer 228 and part of a sidewall of the insulating layer 234, which are exposed in a contact hole formed for electrically connecting the conductive layer 232a and the conductive layer 226a.

Part of the conductive layer 236c is in contact with part of the conductive layer 226a. In addition, part of the conductive layer 236c is in contact with part of a sidewall of the insulating layer 228 and part of a sidewall of the insulating layer 234, which are exposed in a contact hole formed for electrical connection with the conductive layer 226a.

The conductive layer 236a is placed in a position overlapping with the semiconductor layer 230a and the insulating layer 234. Thus, the conductive layer 236a has a function of the gate electrode of the transistor 131, a function of a wiring connected to the light-receiving element 121, and a light-shielding function of preventing light emitted by the light-emitting element 111 from entering the semiconductor layer 230a.

The conductive layer 236c is placed in a position overlapping with the semiconductor layer 230b and the insulating layer 234. Thus, the conductive layer 236a has a function of the gate electrode or the back gate electrode of the transistor 131, a function of a wiring connected to the light-receiving element 121, and a light-shielding function of preventing light emitted by the light-emitting element 112 from entering the semiconductor layer 230b.

The conductive layer 236b is placed in a position overlapping with part of the conductive layer 232b and is provided so that the insulating layer 234 is sandwiched therebetween. Thus, the capacitor 133 is formed in such a manner that the conductive layer 236b and the conductive layer 232b are placed so that the insulating layer 234 is sandwiched therebetween.

An insulating layer 238 is provided over the conductive layer 236a to the conductive layer 236c. A conductive layer 240a and a conductive layer 240b are provided over the insulating layer 238. The conductive layer 240a corresponds to a pixel electrode of the light-receiving element 121. The conductive layer 240b corresponds to a pixel electrode of the light-receiving element 122. The conductive layer 240a is in contact with the conductive layer 236a, and the conductive layer 240b is in contact with the conductive layer 236c. Note that the insulating layer 218, the insulating layer 222, the insulating layer 224, the insulating layer 228, the insulating layer 234, and the insulating layer 238 preferably have a light-transmitting property.

An organic sensor layer 242a is provided over the conductive layer 240a, and a conductive layer 244a is provided over the organic sensor layer 242a. An organic sensor layer 242b is provided over the conductive layer 240b, and a conductive layer 244b is provided over the organic sensor layer 242b.

Thus, the light-receiving element 121 is formed by the conductive layer 240a, the organic sensor layer 242a, and the conductive layer 244a. The light-receiving element 122 is formed by the conductive layer 240b, the organic sensor layer 242b, and the conductive layer 244b. Note that it is preferable to provide an insulating layer 246 over the light-receiving element 121 and the light-receiving element 122. It is possible to inhibit deterioration of the light-receiving elements due to water or the like.

Figure 5B:
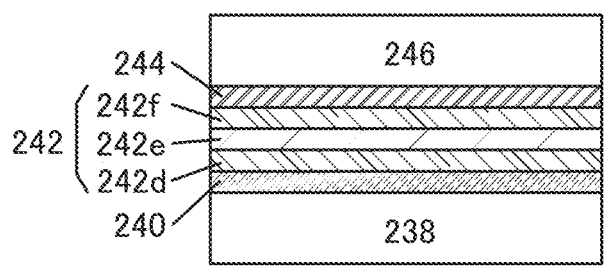
FIG. 5B is a cross-sectional view of a light-receiving element.

The light-receiving elements are described with reference to FIG. 5B. In FIG. 5B, the conductive layer 240a and the conductive layer 240b are illustrated as a conductive layer 240, the organic sensor layer 242a and the organic sensor layer 242b are illustrated as an organic sensor layer 242, and the conductive layer 244a and the conductive layer 244b are illustrated as a conductive layer 244.

The organic sensor layer 242 includes a buffer layer 242d, an active layer 242e, and a buffer layer 242f. The buffer layer 242d and the buffer layer 242f may each have a single-layer structure or a stacked-layer structure.

The buffer layer 242d can include one or both of a hole-injection layer and a hole-transport layer, for example. The buffer layer 242f can include one or both of an electron-injection layer and an electron-transport layer, for example. Therefore, in the case where the buffer layer 242d includes a hole-injection layer, the hole-injection layer functions as a hole-transport layer. Similarly, in the case where the buffer layer 242f includes an electron-injection layer, the electron-injection layer functions as an electron-transport layer.

The hole-injection layer is a layer that injects holes from an anode to a light-emitting element and contains a material with a high hole-injection property. As the material with a high hole-injection property, an aromatic amine compound or a composite material containing a hole-transport material and an acceptor material (an electron-accepting material) can be used.

The hole-transport layer is a layer that transports holes generated in the active layer on the basis of incident light, to the anode. The hole-transport layer is a layer including a hole-transport material. As the hole-transport material, a substance having a hole mobility greater than or equal to $1\times10^{-6}$ cm$^2$/Vs is preferable. Note that other substances can also be used as long as they have a property of transporting more holes than electrons. As the hole-transport material, materials having a high hole-transport property, such as a π-electron-rich heteroaromatic compound (e.g., a carbazole derivative, a thiophene derivative, and a furan derivative) and an aromatic amine (a compound having an aromatic amine skeleton), are preferable.

The electron-transport layer is a layer that transports electrons generated in the active layer on the basis of incident light, to the cathode. Note that the electron-transport layer is layer that contains an electron-transport material. As the electron-transport material, a substance having an electron mobility greater than or equal to $1\times10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer that injects electrons from the cathode to the light-emitting element and contains a material with a high electron-injection property. As the material with a high electron-injection property, an alkali metal, an alkaline earth metal, or a compound thereof can be used. As the material with a high electron-injection property, a composite material containing an electron-transport material and an donor material (an electron-donating material) can also be used.

The active layer 242e includes an organic compound. Examples of an n-type semiconductor material included in the active layer 242e are electron-accepting organic semiconductor materials such as fullerene (e.g., $C_{60}$ and $C_{70}$) and derivatives thereof. Examples of a p-type semiconductor material included in the active layer 242e are electron organic semiconductor materials such as copper(II) phthalocyanine (CuPc) and tetraphenyldibenzoperiflanthene (DBP). The active layer 242e is preferably formed by co-evaporation of an n-type semiconductor and a p-type semiconductor.

Consequently, the light-receiving element 121 can be placed over the light-emitting element 111, and the light-receiving element 122 can be placed over the light-emitting element 112. Thus, in the solid-state relay 100, the light-emitting element and the light-receiving element can be formed over one substrate 210; therefore, a step of bonding the circuit 101 including the light-emitting element and the circuit 102 including the light-receiving element and the switch can be omitted. Alternatively, a step of fixing the circuit 101 and the circuit 102 to an IC case can be omitted.

The conductive layer 232b has a function of isolating the light-emitting element 111 and the light-emitting element 112. Thus, the conductive layer 232b can prevent the light 150c emitted by the light-emitting element 111 from entering the light-receiving element 122. In addition, the conductive layer 232b can prevent the light 150d emitted by the light-emitting element 112 from entering the light-receiving element 121. Note that the distance between the light-emitting element 111 and the light-receiving element 121 is preferably less than or equal to 3 µm, further preferably less than or equal to 1 µm.

Figure 6A:
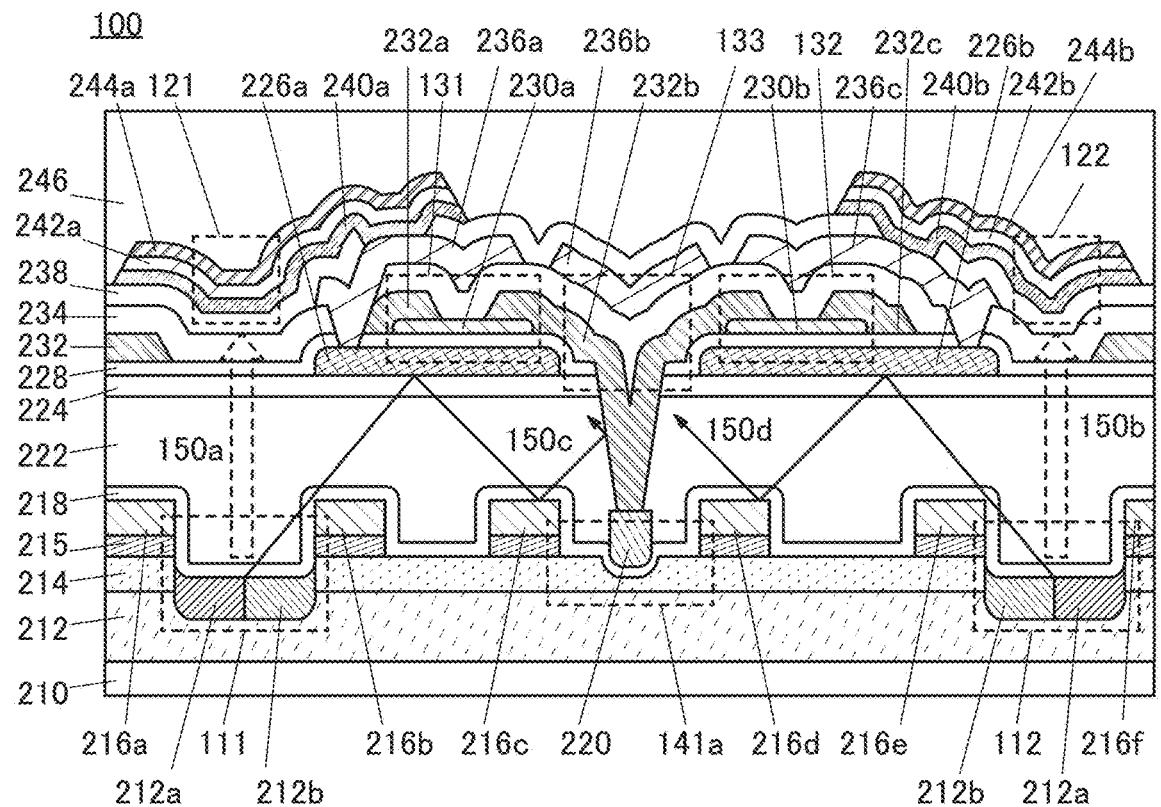
FIG. 6A and FIG. 6B are each a cross-sectional view of a solid-state relay.

FIG. 6A is a diagram illustrating a different solid-state relay from FIG. 5A.

FIG. 6A differs from FIG. 5A in that a conductive layer 215 is provided between the semiconductor layer 214 and the conductive layer 216a to the conductive layer 216f to improve an ohmic property between the semiconductor layer 214 and the conductive layer 216a to the conductive layer 216f. Note that the conductive layer 215 may be rephrased as an ohmic electrode. A conductive oxide is preferably used for the ohmic electrode. For example, a zinc oxide film can be used as the conductive oxide. Note that the zinc oxide film has features of having an n-type semiconductor when it is not doped and being easily doped. For example, when the zinc oxide film is doped with any one of aluminum and gallium, the zinc oxide film has a resistivity of approximately $10^{-3}$ to $10^{-4}$ Ω·cm. In addition, the zinc oxide film can be deposited by a sputtering method.

Figure 6B:
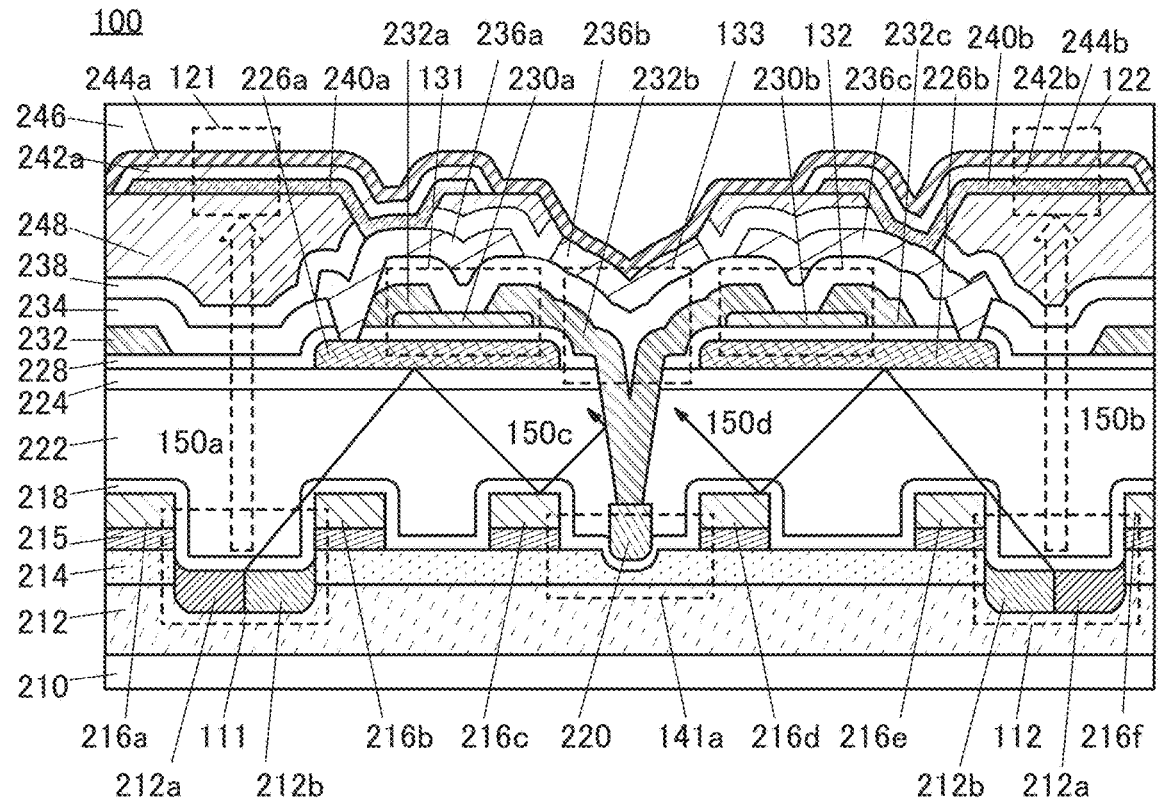

FIG. 6B is a diagram illustrating a different solid-state relay from FIG. 6A. FIG. 6B differs from FIG. 6A in that an insulating layer 248 containing a fluorescent substance is provided over the insulating layer 238. When the fluorescent substance is placed between the light-emitting element and the light-receiving element, light (the light 150a and 150b) emitted by the light-emitting elements is converted into light having a longer wavelength than the light owing to the fluorescent substance. It is preferable that the wavelength range that can be detected by the light-receiving element be a longer wavelength range than the wavelength range of light emitted by the light-emitting element. The insulating layer 248 containing the fluorescent substance can function as a planarization film. Thus, the planarity of a region where the light-receiving element receives light is improved. In other words, variations of the light-receiving elements and the like are improved.

Furthermore, the conductive layer 244 is preferably in contact with the conductive layer 236b, the insulating layer 238, and the insulating layer 248. Although not illustrated in FIG. 5A or FIG. 6A, to connect the conductive layer 244 and the conductive layer 236b, they need to be connected via a contact hole, and therefore a processing step is necessary. When the conductive layer 244 and the conductive layer 236b are directly connected, the distance of a wiring can be shortened and the number of processing steps can be reduced. Accordingly, the chip size of the solid-state relay 100 can be reduced to improve productivity, and the number of processing steps of the solid-state relay 100 can be reduced to reduce manufacturing cost. In addition, when the conductive layer 244 is placed to cover the organic sensor layer 242, the conductive layer 244 can protect the organic sensor layer 242 from moisture or the like that enters from the outside.

Figure 7A:
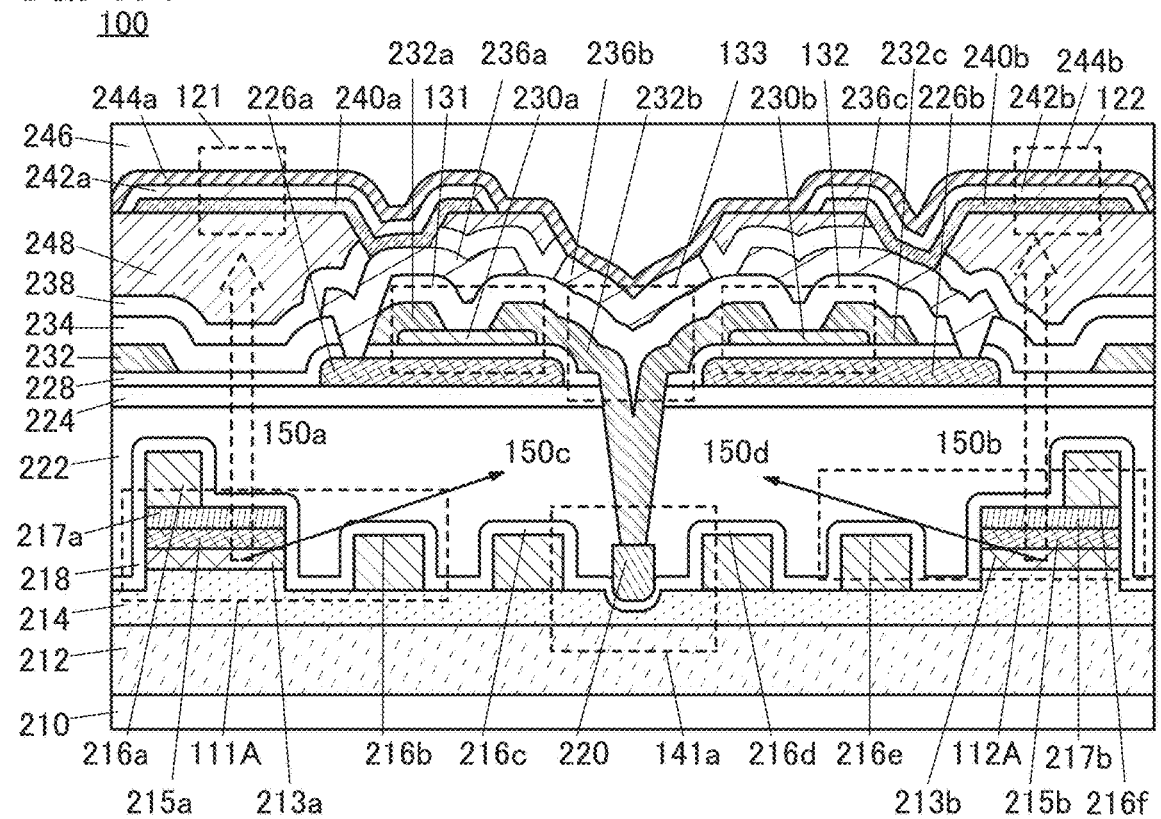
FIG. 7A and FIG. 7B are each a cross-sectional view of a solid-state relay.

FIG. 7A is a diagram illustrating a different solid-state relay 100 from FIG. 6B. FIG. 7A differs from FIG. 6B in that a light-emitting element 111A and a light-emitting element 112A are formed over the semiconductor layer 214. In the light-emitting element 111A, an epitaxially-grown light-emitting layer 213a is provided over a semiconductor layer 114, an epitaxially-grown semiconductor layer 215a is provided over the light-emitting layer 213a, and an epitaxially-grown conductive layer 217a is provided over the semiconductor layer 215a. The conductive layer 216a is provided over 217a of a semiconductor layer. The semiconductor layer 214 is n-type GaN, the light-emitting layer 213a is GaN containing indium, and the semiconductor layer 215a is p-type GaN. As an example, silicon, germanium, or the like is contained in the n-type GaN, and magnesium, zinc, cadmium, beryllium, or the like is contained in the p-type GaN. The conductive layer 217a is a conductive layer having a light-transmitting property.

In the light-emitting element 111A and the light-emitting element 112A, the light-emitting layer 213a and a light-emitting layer 213b, the semiconductor layer 215a and a semiconductor layer 215b, or the conductive layer 217a and a conductive layer 217b can be formed using the same material in the same step. Note that element isolation can be performed on the light-emitting element 111A and the light-emitting element 112A by dry etching treatment.

In the solid-state relay 100, the transistor 141a is preferably formed in a region that is provided for element isolation of the light-emitting element 111A and the light-emitting element 112A. The anode electrode or the cathode electrode of each of the light-emitting element 111A and the light-emitting element 112A or the conductive layer 216a to the conductive layer 216f each functioning as the source or drain of the transistor 141a can be formed using the same material in the same step.

Figure 7B:
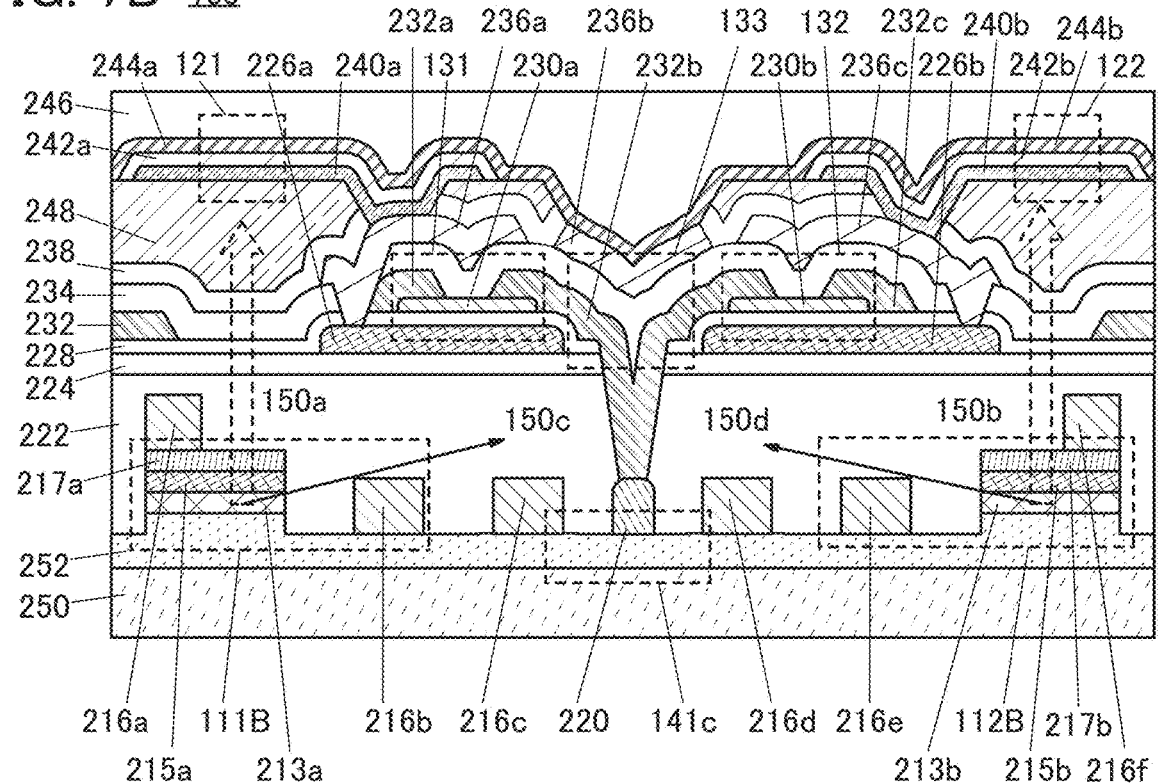

FIG. 7B is a diagram illustrating a different solid-state relay 100 from FIG. 7A. FIG. 7B differs from FIG. 7A in that the transistor 141a, the light-emitting element 111, and the light-emitting element 112 are formed over a substrate 250. The substrate 250 is preferably gallium oxide.

In the light-emitting element 111A, an epitaxially-grown semiconductor layer 252 is provided over the substrate 250, the epitaxially-grown light-emitting layer 213a is provided over the semiconductor layer 252, the epitaxially-grown semiconductor layer 215a is provided over the light-emitting layer 213a, and the epitaxially-grown conductive layer 217a is provided over the semiconductor layer 215a. The conductive layer 216a is provided over 217a of a semiconductor layer. Note that the substrate 250 is, for example, gallium oxide containing magnesium. The semiconductor layer 252 is, for example, an n-type gallium oxide containing tin, the light-emitting layer 213a is GaN containing indium, and the semiconductor layer 215a is p-type GaN.

In the solid-state relay 100, a transistor 141c is preferably formed in a region provided for element isolation of the light-emitting element 111A and the light-emitting element 112A. Note that the transistor 141c is a transistor that has a MESFET structurer including gallium oxide in a channel formation region. The anode electrode or the cathode electrode of each of the light-emitting element 111A and the light-emitting element 112A or the conductive layer 216a to the conductive layer 216f each functioning as the source or the drain of the transistor 141a can be formed using the same material in the same step.

As described above, the circuit 101 and the circuit 102 are formed over the same substrate, whereby the solid-state relay 100 with a novel structure can be provided. Furthermore, light emitted by the light-emitting element can be blocked by the gates or the back gates of the transistor 131 and the transistor 132, the conductive layer 232b connecting the transistors, the insulating layer 248 containing a fluorescent substance, or the like. Accordingly, the solid-state relay 100 in which the first signal is favorably isolated from the second signal can be provided. In addition, when an oxide semiconductor or a compound semiconductor is used in a transistor 104a or a transistor 104c, the low-loss solid-state relay 100 with favorable electrical characteristics that can be ready for high power can be provided. When the circuit 101 and the circuit 102 are formed over the same substrate and the light-receiving element placed in a position overlapping with the light-emitting element is formed, the solid-state relay 100 with a structure suitable for downsizing can be provided. Moreover, with a structure without a movable contact by including the light-emitting element and the light-receiving element, the highly reliable solid-state relay 100 can be provided.

Note that the formation area of the light-emitting element includes the anode electrode and the cathode electrode. The formation area of the light-receiving element is the larger of the areas of the anode electrode and the cathode electrode. Accordingly, an overlap of the light-emitting element with the light-receiving element means that part of the formation area of the light-emitting element and part of the formation area of the light-receiving element overlap with each other.

Since the solid-state relay 100 can be formed using a semiconductor process as described above, the solid-state relay 100 can be rephrased as a semiconductor device.

At least part of this embodiment can be implemented in combination with the other embodiments described in this specification as appropriate.

Embodiment 2

In this embodiment, transistors that can be used in the solid-state relay of one embodiment of the present invention will be described.

Structure Example 1 of Transistor

Figure 8A:
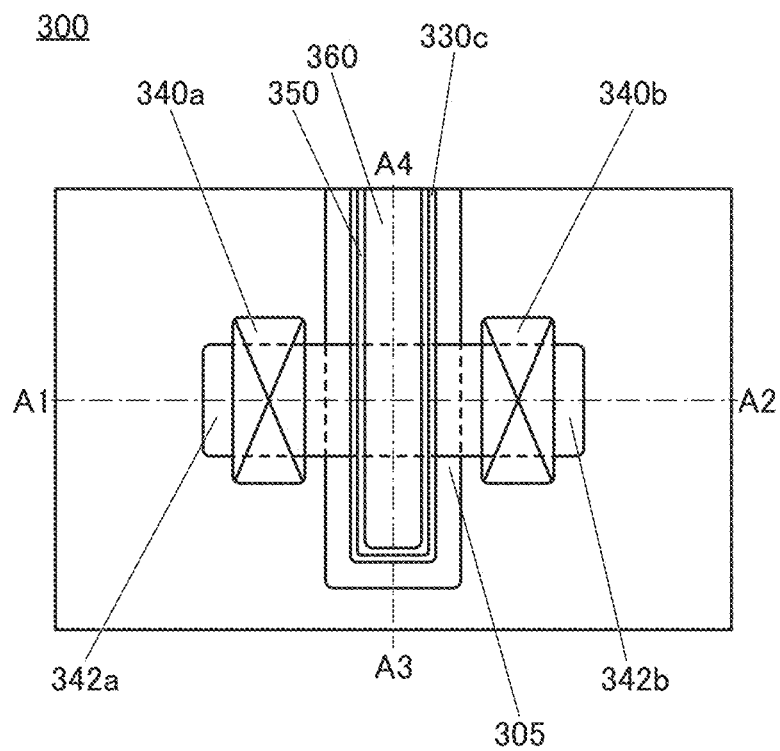
FIG. 8A is a top view illustrating a structure example of a transistor.
Figure 8C:
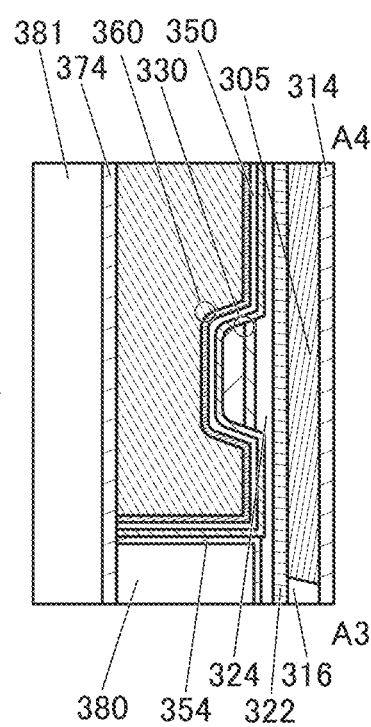
FIG. 8B and FIG. 8C are cross-sectional views illustrating the structure example of the transistor.
Figure 8B:
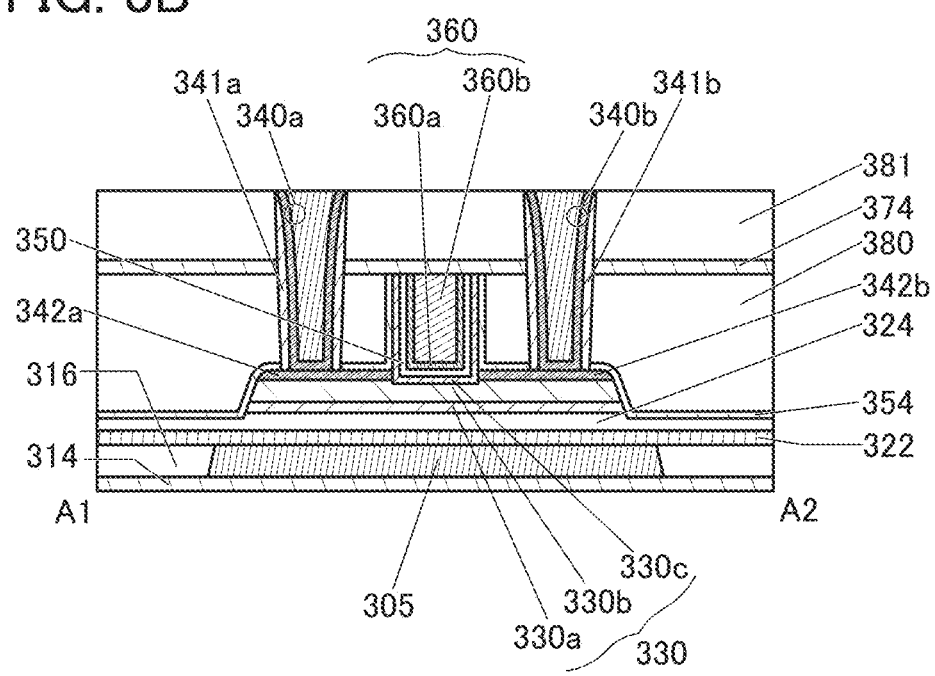

FIG. 8A, FIGS. 8B, and (C) are a top view and cross-sectional views of a transistor 300 that can be used in a display device of one embodiment of the present invention, and the periphery of the transistor 300. The transistor 300 can be used as the transistor 131 or the transistor 132 described in Embodiment 1 and the like.

FIG. 8A is a top view of the transistor 300. FIG. 8B and FIG. 8C are cross-sectional views of the transistor 300. FIG.

8B is a cross-sectional view taken along dashed-dotted line A1-A2 in FIG. 8A, which corresponds to a cross-sectional view in the channel length direction of the transistor 300. FIG. 8C is a cross-sectional view taken along dashed-dotted line A3-A4 in FIG. 8A, which corresponds to a cross-sectional view in the channel width direction of the transistor 300. Note that for clarity of the drawing, some components are not illustrated in the top view of FIG. 8A.

The transistor 300 includes a metal oxide 330a over a substrate (not illustrated); a metal oxide 330b over the metal oxide 330a; a conductor 342a and a conductor 342b that are separated from each other over the metal oxide 330b; an insulator 380 that is positioned over the conductor 342a and the conductor 342b and has an opening between the conductor 342a and the conductor 342b; a conductor 360 in the opening; an insulator 350 between the conductor 360 and the metal oxide 330b, the conductor 342a, the conductor 342b, and the insulator 380; and a metal oxide 330c between the insulator 350 and the metal oxide 330b, the conductor 342a, the conductor 342b, and the insulator 380. Here, as illustrated in FIG. 8B and FIG. 8C, the top surface of the conductor 360 is substantially aligned with the top surfaces of the insulator 350, an insulator 354, the metal oxide 330c, and the insulator 380. Hereinafter, the metal oxide 330a, the metal oxide 330b, and the metal oxide 330c may be collectively referred to as a metal oxide 330. The conductor 342a and the conductor 342b may be collectively referred to as a conductor 342 in some cases.

As illustrated in FIG. 8B, in the transistor 300, the side surfaces of the conductor 342a and the conductor 342b closer to the conductor 360 are substantially perpendicular. Note that the transistor 300 illustrated in FIG. 8 is not limited thereto, and the angle formed between the side surface and the bottom surface of the conductor 342a and the conductor 342b may be greater than or equal to 10° and less than or equal to 80°, preferably greater than or equal to 30° and less than or equal to 60°. The facing side surfaces of the conductor 342a and the conductor 342b may each have a plurality of surfaces.

As illustrated in FIG. 8B and FIG. 8C, the insulator 354 is preferably provided between the insulator 380 and an insulator 324, the metal oxide 330a, the metal oxide 330b, the conductor 342a, the conductor 342b, and the metal oxide 330c. Here, as illustrated in FIG. 8B and FIG. 8C, the insulator 354 preferably includes a region in contact with the side surface of the metal oxide 330c, the top surface and side surface of the conductor 342a, the top surface and side surface of the conductor 342b, the side surface of the metal oxide 330a, the side surface of the metal oxide 330b, and the top surface of the insulator 324.

In the transistor 300, three layers of the metal oxide 330a, the metal oxide 330b, and the metal oxide 330c are stacked in and around the region where the channel is formed (hereinafter also referred to as channel formation region); however, the present invention is not limited thereto. For example, a two-layer structure of the metal oxide 330b and the metal oxide 330c or a stacked-layer structure of four or more layers may be employed. Although the transistor 300 has a structure in which the conductor 360 has a stacked-layer structure of two layers, the present invention is not limited thereto. For example, the conductor 360 may have a single-layer structure or a stacked-layer structure of three or more layers. Furthermore, each of the metal oxide 330a, the metal oxide 330b, and the metal oxide 330c may have a stacked-layer structure of two or more layers.

For example, when the metal oxide 330c has a stacked-layer structure including a first metal oxide and a second metal oxide over the first metal oxide, the first metal oxide preferably has a composition similar to that of the metal oxide 330b and the second metal oxide preferably has a composition similar to that of the metal oxide 330a.

Here, the conductor 360 functions as a gate electrode of the transistor, and the conductor 342a and the conductor 342b function as a source electrode and a drain electrode. As described above, the conductor 360 is formed to be embedded in the opening of the insulator 380 and the region between the conductor 342a and the conductor 342b. Here, the positions of the conductor 360, the conductor 342a, and the conductor 342b with respect to the opening of the insulator 380 are selected in a self-aligned manner. That is, in the transistor 300, the gate electrode can be positioned between the source electrode and the drain electrode in a self-aligned manner. Therefore, the conductor 360 can be formed without an alignment margin, resulting in a reduction in the area occupied by the transistor 300. Accordingly, a high-definition display device can be provided. In addition, a display device with a narrow frame can be provided.

As illustrated in FIG. 8, the conductor 360 preferably includes a conductor 360a provided inside the insulator 350 and a conductor 360b provided to be embedded inside the conductor 360a.

As illustrated in FIG. 8A, FIGS. 8B, and (C), the transistor 300 preferably includes an insulator 314 over the substrate (not illustrated), an insulator 316 over the insulator 314, a conductor 305 embedded in the insulator 316, an insulator 322 over the insulator 316 and the conductor 305, and the insulator 324 over the insulator 322. The metal oxide 330a is preferably positioned over the insulator 324.

An insulator 374 and an insulator 381 functioning as interlayer films are preferably provided over the transistor 300. Here, the insulator 374 is preferably provided in contact with the top surfaces of the conductor 360, the insulator 350, the insulator 354, the metal oxide 330c, and the insulator 380.

The insulator 322, the insulator 354, and the insulator 374 preferably have a function of inhibiting diffusion of at least one of hydrogen (e.g., hydrogen atoms and hydrogen molecules). For example, the insulator 322, the insulator 354, and the insulator 374 preferably have lower hydrogen permeability than the insulator 324, the insulator 350, and the insulator 380. Moreover, the insulator 322 and the insulator 354 preferably have a function of inhibiting diffusion of at least one of oxygen (e.g., oxygen atoms and oxygen molecules). For example, the insulator 322 and the insulator 354 preferably have a lower oxygen permeability than the insulator 324, the insulator 350, and the insulator 380.

Here, the insulator 324, the metal oxide 330, and the insulator 350 are separated by the insulator 380, the insulator 381, the insulator 354, and the insulator 374. Thus, for the insulator 324, the metal oxide 330, and the insulator 350, the entry of impurities such as hydrogen and excess oxygen contained in the insulator 380 and the insulator 381 into the insulator 324, the metal oxide 330a, the metal oxide 330b, and the insulator 350 can be inhibited.

A conductor 340 (a conductor 340a and a conductor 340b) that is electrically connected to the transistor 300 and functions as a plug is preferably provided. Note that an insulator 341 (an insulator 341a and an insulator 341b) is provided in contact with the side surface of the conductor 340 functioning as a plug. In other words, the insulator 341 is provided in contact with the inner wall of an opening in the insulator 354, the insulator 380, the insulator 374, and the insulator 381. Alternatively, a first conductor of the conductor 340 may be provided in contact with the side surface of the insulator 341 and a second conductor of the conductor 340 may be provided on the inner side of the first conductor. Here, the level of a top surface of the conductor 340 and the level of a top surface of the insulator 381 can be substantially the same. Although the first conductor of the conductor 340 and the second conductor of the conductor 340 are stacked in the transistor 300, the present invention is not limited thereto. For example, the conductor 340 may have a single-layer structure or a stacked-layer structure of three or more layers. In the case where a structure body has a stacked-layer structure, layers may be distinguished by ordinal numbers corresponding to the formation order.

In the transistor 300, a metal oxide functioning as an oxide semiconductor (hereinafter also referred to as an oxide semiconductor) is preferably used for the metal oxide 330 including the channel formation region (the metal oxide 330a, the metal oxide 330b, and the metal oxide 330c). For example, as the metal oxide to be the channel formation region of the metal oxide 330, it is preferable to use a metal oxide having a band gap of 2 eV or more, preferably 2.5 eV or more, as described above.

As illustrated in FIG. 8B, the metal oxide 330b may have a smaller thickness in a region that is not overlapped by the conductor 342 than in a region overlapped by the conductor 342. The thin region is formed when part of the top surface of the metal oxide 330b is removed at the time of forming the conductor 342a and the conductor 342b. When a conductive film to be the conductor 342 is formed, a low-resistance region may be formed on the top surface of the metal oxide 330b in the vicinity of the interface with the conductive film. Removing the low-resistance region between the conductor 342a and the conductor 342b on the top surface of the metal oxide 330b in the above manner can inhibit formation of the channel in the region.

According to one embodiment of the present invention, a display device that includes small-size transistors and has high definition can be provided. A display device that includes transistors with a high on-state current and achieves high luminance can be provided. A display device that includes fast transistors and operates at high speed can be provided. A display device that includes transistors having stable electrical characteristics and is highly reliable can be provided. A display device that includes transistors with a low off-state current and achieves low power consumption can be provided.

The structure of the transistor 300 that can be used in the display device according to one embodiment of the present invention is described in detail.

The conductor 305 is placed so as to include a region overlapping with the metal oxide 330 and the conductor 360. The conductor 305 is preferably provided to be embedded in the insulator 316. Preferably, the planarity of the top surface of the conductor 305 is made favorable. For example, the average surface roughness (Ra) of the top surface of the conductor 305 is less than or equal to 1 nm, preferably less than or equal to 0.5 nm, further preferably less than or equal to 0.3 nm. This achieves favorable planarity of the insulator 324 formed over the conductor 305 and increases the crystallinity of the metal oxide 330b and the metal oxide 330c.

Here, the conductor 360 sometimes functions as a first gate (also referred to as a top gate) electrode. The conductor 305 functions as a second gate (also referred to as a back gate) electrode in some cases. In that case, the threshold voltage of the transistor 300 can be controlled by changing a potential applied to the conductor 305 not in synchronization with but independently of a potential applied to the conductor 360. In particular, the threshold voltage of the transistor 300 can be higher than 0 V and the off-state current can be reduced by applying a negative potential to the conductor 305. Thus, a drain current of the transistor 300 at the time when a potential applied to the conductor 360 is 0 V can be smaller in the case where a negative potential is applied to the conductor 305 than in the case where the negative potential is not applied to the conductor 305.

The conductor 305 is preferably larger than the channel formation region of the metal oxide 330. It is particularly preferable that the conductor 305 also extend to a region outside an end portion of the metal oxide 330 that intersects with the channel width direction, as illustrated in FIG. 8C. That is, the conductor 305 and the conductor 360 preferably overlap each other with the insulator positioned therebetween, in a region beyond the side surface of the metal oxide 330 in the channel width direction.

With the above structure, the channel formation region of the metal oxide 330 can be electrically surrounded by electric fields of the conductor 360 functioning as the first gate electrode and electric fields of the conductor 305 functioning as the second gate electrode.

Furthermore, as illustrated in FIG. 8C, the conductor 305 extends to function as a wiring as well. However, without limitation to this structure, a structure where a conductor functioning as a wiring is provided below the conductor 305 may be employed.

A conductive material containing tungsten, copper, or aluminum as its main component is preferably used for the conductor 305. Note that the conductor 305 is illustrated as a single layer but may have a stacked-layer structure, for example, a stack of any of the above conductive materials and titanium or titanium nitride.

In addition, a conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, a conductor through which the above impurities are less likely to pass may be provided under the conductor 305. Alternatively, it is preferable to provide a conductor having a function of inhibiting diffusion of oxygen (e.g., at least one of oxygen atoms and oxygen molecules), that is, a conductor through which oxygen is less likely to pass. Note that in this specification, a function of inhibiting diffusion of impurities or oxygen means a function of inhibiting diffusion of any one or all of the above impurities and oxygen.

When the conductor having a function of inhibiting oxygen diffusion is provided under the conductor 305, a reduction in conductivity of the conductor 305 due to oxidation of the conductor 305 can be inhibited. As the conductor having a function of inhibiting oxygen diffusion, tantalum, tantalum nitride, ruthenium, or ruthenium oxide is preferably used, for example. Thus, the conductor 305 is a single layer or a stacked layer of the above conductive materials.

The insulator 314 preferably functions as a barrier insulating film for inhibiting impurities such as water or hydrogen from entering the transistor 300 from the substrate side. Accordingly, the insulator 314 is preferably formed using an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, an insulating material through which the above impurities are less likely to pass. Alternatively, it is preferable to use an insulating material having a function of inhibiting diffusion of oxygen (e.g., at least one of an oxygen atom, an oxygen molecule, and the like) (through which the oxygen is less likely to pass).

For example, aluminum oxide or silicon nitride is preferably used for the insulator 314. Accordingly, it is possible to inhibit diffusion of impurities such as water or hydrogen into the transistor 300 side from the substrate side through the insulator 314. It is also possible to inhibit diffusion of oxygen contained in the insulator 324 and the like toward the substrate through the insulator 314.

The relative permittivity of each of the insulator 316, the insulator 380, and the insulator 381 functioning as an interlayer film is preferably lower than that of the insulator 314. When a material with a low relative permittivity is used for an interlayer film, the parasitic capacitance generated between wirings can be reduced. For example, for the insulator 316, the insulator 380, and the insulator 381, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate.

The insulator 322 and the insulator 324 function as a gate insulator.

Here, it is preferred that the insulator 324 in contact with the metal oxide 330 release oxygen by heating. In this specification and the like, oxygen that is released by heating is referred to as excess oxygen in some cases. For example, silicon oxide or silicon oxynitride can be used as appropriate for the insulator 324. When such an insulator containing excess oxygen is provided in contact with the metal oxide 330, oxygen vacancies in the metal oxide 330 can be reduced and the reliability of the transistor 300 can be improved.

Specifically, the insulator 324 is preferably formed using an oxide material that releases part of oxygen by heating. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in the range of 100° C. to 700° C. or 100° C. to 400° C.

As illustrated in FIG. 8C, the insulator 324 is sometimes thinner in a region overlapped by neither the insulator 354 nor the metal oxide 330b than in the other regions. In the insulator 324, the region overlapped by neither the insulator 354 nor the metal oxide 330b preferably has a thickness with which released oxygen can be adequately diffused.

Like the insulator 314 and the like, the insulator 322 preferably functions as a barrier insulating film that inhibits entry of impurities such as water or hydrogen into the transistor 300 from the substrate side. For example, the insulator 322 preferably has a lower hydrogen permeability than the insulator 324. When the insulator 324, the metal oxide 330, the insulator 350, and the like are surrounded by the insulator 322, the insulator 354, and the insulator 374, entry of impurities such as water or hydrogen into the transistor 300 from the outside can be inhibited.

Furthermore, it is preferable that the insulator 322 have a function of inhibiting diffusion of oxygen (e.g., at least one of an oxygen atom, an oxygen molecule, and the like) (through which the above oxygen is less likely to pass). For example, the insulator 322 preferably has a lower oxygen permeability than the insulator 324. The insulator 322 preferably has a function of inhibiting diffusion of oxygen and impurities, in which case oxygen contained in the metal oxide 330 is less likely to diffuse toward the substrate. The insulator 322 can also inhibit reaction of the conductor 305 with oxygen contained in the insulator 324 and oxygen contained in the metal oxide 330.

As the insulator 322, an insulator containing an oxide of aluminum and/or an oxide of hafnium, which are insulating materials, is preferably used. As the insulator containing an oxide of one or both of aluminum and hafnium, aluminum oxide or hafnium oxide is preferably used.

Alternatively, an oxide containing aluminum and hafnium (hafnium aluminate) or the like is preferably used. The insulator 322 formed using such a material functions as a layer inhibiting oxygen release from the metal oxide 330 and entry of impurities such as hydrogen into the metal oxide 330 from the periphery of the transistor 300.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

The insulator 322 may have a single-layer structure or a stacked-layer structure using an insulator containing a high-k material, such as aluminum oxide, hafnium oxide, tantalum oxide, zirconium oxide, lead zirconate titanate (PZT), strontium titanate (SrTiO$_3$), or (Ba,Sr)TiO$_3$ (BST). As miniaturization and high integration of transistors progress, a problem such as generation of leakage current may arise because of a thinner gate insulator. When a high-k material is used for an insulator functioning as the gate insulator, a gate potential at the time when the transistor operates can be lowered while the physical thickness of the gate insulator is maintained.

Note that the insulator 322 and the insulator 324 may each have a stacked-layer structure of two or more layers. In such cases, without limitation to a stacked-layer structure formed of the same material, a stacked-layer structure formed of different materials may be employed. For example, an insulator similar to the insulator 324 may be provided below the insulator 322.

The metal oxide 330 includes the metal oxide 330a, the metal oxide 330b over the metal oxide 330a, and the metal oxide 330c over the metal oxide 330b. The metal oxide 330a under the metal oxide 330b can inhibit diffusion of impurities into the metal oxide 330b from the components formed below the metal oxide 330a. The metal oxide 330c over the metal oxide 330b can inhibit diffusion of impurities into the metal oxide 330b from the components formed above the metal oxide 330c.

Note that the metal oxide 330 preferably has a stacked-layer structure of a plurality of oxide layers that differ in the atomic ratio of metal atoms. Specifically, the atomic ratio of the element M to the constituent elements in the metal oxide used as the metal oxide 330a is preferably higher than that in the metal oxide used as the metal oxide 330b. The atomic ratio of the element M to In in the metal oxide used as the metal oxide 330a is preferably higher than that in the metal oxide used as the metal oxide 330b. The atomic ratio of In to the element M in the metal oxide used as the metal oxide 330b is preferably higher than that in the metal oxide used as the metal oxide 330a. The metal oxide 330c can be formed using a metal oxide that can be used as the metal oxide 330a or the metal oxide 330b.

The metal oxide 330a, the metal oxide 330b, and the metal oxide 330c preferably have crystallinity, and in particular, it is preferable to use a CAAC-OS. An oxide having crystallinity, such as a CAAC-OS, has a dense structure with small amounts of impurities and defects (e.g., oxygen vacancies) and high crystallinity. This reduces oxygen extraction from the metal oxide 330b by the source electrode or the drain electrode. Accordingly, oxygen extraction from the metal oxide 330b can be inhibited even when heat treatment is performed. Thus, the transistor 300 is stable against high temperatures in the manufacturing process (i.e., thermal budget).

The energy of the conduction band minimum of each of the metal oxide 330a and the metal oxide 330c is preferably higher than that of the metal oxide 330b. In other words, the electron affinity of each of the metal oxide 330a and the metal oxide 330c is preferably smaller than that of the metal oxide 330b. In that case, the metal oxide 330c is preferably formed using a metal oxide that can be used as the metal oxide 330a. Specifically, the atomic ratio of the element M to the constituent elements in the metal oxide used as the metal oxide 330c is preferably higher than that in the metal oxide used as the metal oxide 330b. The atomic ratio of the element M to In in the metal oxide used as the metal oxide 330c is preferably higher than that in the metal oxide used as the metal oxide 330b. The atomic ratio of In to the element M in the metal oxide used as the metal oxide 330b is preferably higher than that in the metal oxide used as the metal oxide 330c.

Here, the energy level of the conduction band minimum is gradually varied at a junction portion of each of the metal oxide 330a, the metal oxide 330b, and the metal oxide 330c. In other words, the energy levels of the conduction band minimum at a junction portion of each of the metal oxide 330a, the metal oxide 330b, and the metal oxide 330c continuously vary or are continuously connected. This can be achieved by decrease in the density of defect states in a mixed layer formed at the interface between the metal oxide 330a and the metal oxide 330b and the interface between the metal oxide 330b and the metal oxide 330c.

Specifically, when the metal oxide 330a and the metal oxide 330b or the metal oxide 330b and the metal oxide 330c contain the same element (as a main component) in addition to oxygen, a mixed layer with a low density of defect states can be formed. For example, in the case where the metal oxide 330b is an In—Ga—Zn oxide, an In—Ga—Zn oxide, a Ga—Zn oxide, gallium oxide, or the like may be used as each of the metal oxide 330a and the metal oxide 330c. The metal oxide 330c may have a stacked-layer structure. For example, the metal oxide 3x30c can have a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, the metal oxide 330c may have a stacked-layer structure of an In—Ga—Zn oxide and an oxide that does not contain In.

Specifically, as the metal oxide 330a, a metal oxide having an atomic ratio of In:Ga:Zn=1:3:4 or In:Ga:Zn=1:1:0.5 can be used. As the metal oxide 330b, a metal oxide having an atomic ratio of In:Ga:Zn=4:2:3 or In:Ga:Zn=3:1:2 can be used. As the metal oxide 330c, a metal oxide having an atomic ratio of In:Ga:Zn=1:3:4, In:Ga:Zn=4:2:3, Ga:Zn=2:1, or Ga:Zn=2:5 can be used. Specific examples of a stacked-layer structure of the metal oxide 330c include a stacked-layer structure of a layer having an atomic ratio of In:Ga:Zn=4:2:3 and a layer having an atomic ratio of Ga:Zn=2:1, a stacked-layer structure of a layer having an atomic ratio of In:Ga:Zn=4:2:3 and a layer having an atomic ratio of Ga:Zn=2:5, and a stacked-layer structure of a layer having an atomic ratio of In:Ga:Zn=4:2:3 and gallium oxide.

At this time, the metal oxide 330b serves as a main carrier path. When the metal oxide 330a and the metal oxide 330c have the above structure, the density of defect states at the interface between the metal oxide 330a and the metal oxide 330b and the interface between the metal oxide 330b and the metal oxide 330c can be made low. This reduces the influence of interface scattering on carrier conduction, and the transistor 300 can have a high on-state current and high frequency characteristics. Note that in the case where the metal oxide 330c has a stacked-layer structure, not only the effect of reducing the density of defect state at the interface between the metal oxide 330b and the metal oxide 330c, but also the effect of inhibiting diffusion of the constituent element of the metal oxide 330c toward the insulator 350 can be expected. Specifically, the metal oxide 330c has a stacked-layer structure in which the upper layer is an oxide that does not contain In, whereby the amount of In that would diffuse toward the insulator 350 can be reduced. Since the insulator 350 functions as a gate insulator, the transistor has defects in characteristics when In diffuses. Thus, the metal oxide 330c having a stacked-layer structure allows the display device to have high reliability.

The metal oxide 330 is preferably formed using a metal oxide functioning as an oxide semiconductor. For example, the metal oxide to be the channel formation region of the metal oxide 330 has a band gap of preferably 2 eV or more, further preferably 2.5 eV or more. With the use of a metal oxide having such a wide band gap, the off-state current of the transistor can be reduced. The use of such a transistor can provide a display device with low power consumption.

The conductor 342 (the conductor 342a and the conductor 342b) functioning as the source electrode and the drain electrode is provided over the metal oxide 330b. For the conductor 342, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

When the conductor 342 is provided in contact with the metal oxide 330, the oxygen concentration of the metal oxide 330 in the vicinity of the conductor 342 sometimes decreases. In addition, a metal compound layer that contains the metal contained in the conductor 342 and the component of the metal oxide 330 is sometimes formed in the metal oxide 330 in the vicinity of the conductor 342. In such cases, the carrier density of the region in the metal oxide 330 in the vicinity of the conductor 342 increases, and the region becomes a low-resistance region.

Here, the region between the conductor 342*a* and the conductor 342*b* is formed to overlap with the opening of the insulator 380. In this manner, the conductor 360 can be formed in a self-aligned manner between the conductor 342*a* and the conductor 342*b*.

The insulator 350 functions as a gate insulator. The insulator 350 is preferably in contact with the top surface of the metal oxide 330*c*. For the insulator 350, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide can be used. In particular, silicon oxide and silicon oxynitride are preferable because they are thermally stable.

As in the insulator 324, the concentration of impurities such as water or hydrogen in the insulator 350 is preferably reduced. The thickness of the insulator 350 is preferably greater than or equal to 1 nm and less than or equal to 20 nm.

A metal oxide may be provided between the insulator 350 and the conductor 360. The metal oxide preferably has a function of inhibiting oxygen diffusion from the insulator 350 into the conductor 360. Thus, oxidation of the conductor 360 due to oxygen in the insulator 350 can be inhibited.

The metal oxide functions as part of the gate insulator in some cases. For that reason, when silicon oxide, silicon oxynitride, or the like is used for the insulator 350, the metal oxide is preferably a high-k material with a high relative permittivity. The gate insulator having a stacked-layer structure of the insulator 350 and the metal oxide enables the transistor 300 to be thermally stable and have a high relative permittivity. Accordingly, a gate potential applied during operation of the transistor can be lowered while the physical thickness of the gate insulator is maintained. In addition, the equivalent oxide thickness (EOT) of the insulator functioning as the gate insulator can be reduced.

Specifically, a metal oxide containing one or more of hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, such as aluminum oxide, hafnium oxide, or an oxide containing aluminum and hafnium (hafnium aluminate).

Although FIG. 8 shows that the conductor 360 has a two-layer structure, the conductor 360 may have a single-layer structure or a stacked-layer structure of three or more layers.

The conductor 360*a* is preferably formed using the aforementioned conductive material having a function of inhibiting diffusion of impurities such as hydrogen atoms, hydrogen molecules, water molecules, nitrogen atoms, nitrogen molecules, nitrogen oxide molecules (e.g., $N_2O$, NO, and $NO_2$), and copper atoms. Alternatively, it is preferable to use a conductive material having a function of inhibiting diffusion of oxygen (e.g., at least one of an oxygen atom, an oxygen molecule, and the like).

When the conductor 360*a* has a function of inhibiting diffusion of oxygen, the conductivity of the conductor 360*b* can be prevented from being lowered because of oxidization of the conductor 360*b* due to oxygen in the insulator 350. As a conductive material having a function of inhibiting diffusion of oxygen, tantalum, tantalum nitride, ruthenium, or ruthenium oxide is preferably used, for example.

A conductive material containing tungsten, copper, or aluminum as its main component is preferably used for the conductor 360*b*. The conductor 360 also functions as a wiring and thus is preferably a conductor having high conductivity. For example, a conductive material containing tungsten, copper, or aluminum as its main component can be used. The conductor 360*b* may have a stacked-layer structure, for example, a stacked-layer structure of titanium or titanium nitride and the above conductive material.

As illustrated in FIG. 8A and FIG. 8C, the side surface of the metal oxide 330 is covered with the conductor 360 in a region of the metal oxide 330*b* that does not overlap with the conductor 342, that is, the channel formation region of the metal oxide 330. Accordingly, electric fields of the conductor 360 functioning as the first gate electrode are likely to act on the side surface of the metal oxide 330. Hence, the transistor 300 can have a higher on-state current and improved frequency characteristics.

The insulator 354 as well as the insulator 314 and the like preferably functions as a barrier insulating film that inhibits impurities such as water or hydrogen from entering the transistor 300 from the insulator 380 side. The insulator 354 preferably has lower hydrogen permeability than the insulator 324, for example. Furthermore, as illustrated in FIG. 8B and FIG. 8C, the insulator 354 preferably includes a region in contact with the side surface of the metal oxide 330*c*, the top surface and side surface of the conductor 342*a*, the top surface and side surface of the conductor 342*b*, the side surface of the metal oxide 330*a*, the side surface of the metal oxide 330*b*, and the top surface of the insulator 324. Such a structure can inhibit entry of hydrogen of the insulator 380 into the metal oxide 330 through top surfaces or side surfaces of the conductor 342*a*, the conductor 342*b*, the metal oxide 330*a*, the metal oxide 330*b*, and the insulator 324.

Furthermore, it is preferable that the insulator 354 have a function of inhibiting diffusion of oxygen (e.g., at least one of an oxygen atom, an oxygen molecule, and the like) (through which the above oxygen is less likely to pass). For example, the insulator 354 preferably has a lower oxygen permeability than the insulator 380 or the insulator 324.

The insulator 354 is preferably deposited by a sputtering method. When the insulator 354 is deposited by a sputtering method in an oxygen-containing atmosphere, oxygen can be added to the vicinity of a region of the insulator 324 that is in contact with the insulator 354. Thus, oxygen can be supplied from the region to the metal oxide 330 through the insulator 324. Here, with the insulator 354 having a function of inhibiting upward oxygen diffusion, diffusion of oxygen from the metal oxide 330 into the insulator 380 can be inhibited. Moreover, with the insulator 322 having a function of inhibiting downward oxygen diffusion, diffusion of oxygen from the metal oxide 330 toward the substrate can be inhibited. In the above manner, oxygen is supplied to the channel formation region of the metal oxide 330. Accordingly, oxygen vacancies in the metal oxide 330 can be reduced, so that the transistor can be prevented from having normally-on characteristics.

As the insulator 354, an insulator containing an oxide of aluminum and/or hafnium is formed, for example. Note that as the insulator containing an oxide of aluminum and/or hafnium, aluminum oxide, hafnium oxide, an oxide containing aluminum and hafnium (hafnium aluminate), or the like is preferably used.

The insulator 324, the insulator 350, and the metal oxide 330 are covered with the insulator 354 having a barrier property against hydrogen, whereby the insulator 380 is separated from the insulator 324, the metal oxide 330, and the insulator 350 by the insulator 354. This inhibits entry of impurities such as hydrogen from the outside of the transistor 300, resulting in favorable electrical characteristics and reliability of the transistor 300.

The insulator 380 is provided over the insulator 324, the metal oxide 330, and the conductor 342 with the insulator 354 therebetween. The insulator 380 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. Silicon oxide and silicon oxynitride are particularly preferable in terms of high thermal stability. A material such as silicon oxide, silicon oxynitride, or porous silicon oxide is preferably used, in which case a region including oxygen that is released by heating can be easily formed.

The concentration of impurities such as water or hydrogen in the insulator 380 is preferably lowered. In addition, the top surface of the insulator 380 may be planarized.

The insulator 374, like the insulator 314 or the like, preferably functions as a barrier insulating film that inhibits entry of impurities such as water and hydrogen into the insulator 380. The insulator 374 can be formed using an insulator that can be used as the insulator 314 or the insulator 354, for example.

The insulator 381 functioning as an interlayer film is preferably provided over the insulator 374. As in the insulator 324 or the like, the concentration of impurities such as water and hydrogen in the insulator 381 is preferably reduced.

The conductor 340a and the conductor 340b are provided in openings formed in the insulator 381, the insulator 374, the insulator 380, and the insulator 354. The conductor 340a and the conductor 340b are provided to face each other with the conductor 360 therebetween. Note that the top surfaces of the conductor 340a and the conductor 340b may be level with the top surface of the insulator 381.

The insulator 341a is provided in contact with the inner wall of the opening in the insulator 381, the insulator 374, the insulator 380, and the insulator 354, and the first conductor of the conductor 340a is formed in contact with the side surface of the insulator 341a. The conductor 342a is positioned on at least part of the bottom portion of the opening, and thus the conductor 340a is in contact with the conductor 342a. Similarly, the insulator 341b is provided in contact with the inner wall of another opening in the insulator 381, the insulator 374, the insulator 380, and the insulator 354, and the first conductor of the conductor 340b is formed in contact with the side surface of the insulator 341b. The conductor 342b is positioned on at least part of the bottom portion of the opening, and thus the conductor 340b is in contact with the conductor 342b.

The conductor 340a and the conductor 340b are preferably formed using a conductive material containing tungsten, copper, or aluminum as its main component. The conductor 340a and the conductor 340b may have a stacked-layer structure.

When the conductor 340 has a stacked-layer structure, the aforementioned conductor having a function of inhibiting diffusion of impurities such as water or hydrogen is preferably used for the conductor in contact with the metal oxide 330a, the metal oxide 330b, the conductor 342, the insulator 354, the insulator 380, the insulator 374, and the insulator 381. For example, tantalum, tantalum nitride, titanium, titanium nitride, ruthenium, or ruthenium oxide is preferably used. The conductive material having a function of inhibiting diffusion of impurities such as water or hydrogen can be used as a single layer or stacked layers. The use of the conductive material can inhibit oxygen added to the insulator 380 from being absorbed by the conductor 340a and the conductor 340b. Moreover, entry of impurities such as water and hydrogen into the metal oxide 330 through the conductor 340a and the conductor 340b from a layer above the insulator 381 can be inhibited.

The insulator 341a and the insulator 341b are formed using any of the insulators that can be used for the insulator 354, for example. Since the insulator 341a and the insulator 341b are provided in contact with the insulator 354, impurities such as water and hydrogen in the insulator 380 or the like can be inhibited from entering the metal oxide 330 through the conductor 340a and the conductor 340b. Furthermore, oxygen contained in the insulator 380 can be inhibited from being absorbed by the conductor 340a and the conductor 340b.

Although not illustrated, a conductor functioning as a wiring may be provided in contact with the top surface of the conductor 340a and the top surface of the conductor 340b. The conductor functioning as a wiring is preferably formed using a conductive material containing tungsten, copper, or aluminum as its main component. The conductor may have a stacked-layer structure, such as a stacked layer of any of the above conductive materials and titanium or titanium nitride. Note that the conductor may be formed to be embedded in an opening provided in an insulator.

Embodiment 3

In this embodiment, a CAC-OS (Cloud-Aligned Composite Oxide Semiconductor) and a CAAC-OS (c-axis Aligned Crystalline Oxide Semiconductor) which are metal oxides that can be used in the OS transistor described in another embodiment will be described.

<Composition of Metal Oxide>

A CAC-OS has a conducting function in part of the material and has an insulating function in another part of the material; as a whole, the CAC-OS has a function of a semiconductor. In the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current drive capability in the on state of the transistor, that is, a high on-state current and high field-effect mobility can be obtained.

In other words, the CAC-OS or the CAC-metal oxide can also be referred to as a matrix composite or a metal matrix composite.

<Structure of Metal Oxide>

Oxide semiconductors can be classified into a single crystal oxide semiconductor and a non-single-crystal oxide semiconductor. Examples of the non-single-crystal oxide semiconductors include a CAAC-OS, a polycrystalline oxide semiconductor, an nc-OS (nanocrystalline oxide semiconductor), an amorphous-like oxide semiconductor (a-like OS), and an amorphous oxide semiconductor.

Oxide semiconductors might be classified in a manner different from the above-described one when classified in terms of the crystal structure. Here, the classification of the crystal structures of an oxide semiconductor is described with reference to FIG. 9A. FIG. 9A is a diagram showing the classification of crystal structures of an oxide semiconductor, typically IGZO (a metal oxide containing In, Ga, and Zn).

As shown in FIG. 9A, IGZO is roughly classified into Amorphous, Crystalline, and Crystal. Amorphous includes completely amorphous. Crystalline includes CAAC (c-axis-aligned crystalline), nc (nanocrystalline), and CAC (Cloud-Aligned Composite). Note that single crystal, poly crystal, and completely amorphous are excluded from the category of "Crystalline". Crystal includes single crystal and poly crystal.

Note that the structures in the thick frame in FIG. 9A are in an intermediate state between Amorphous and Crystal, and belong to a new crystalline phase. This structure is positioned in a boundary region between Amorphous and Crystal. In other words, these structures are completely different from Amorphous, which is energetically unstable, and Crystal.

A crystal structure of a film or a substrate can be analyzed with X-ray diffraction (XRD) images. Here, XRD spectra of quartz glass and IGZO, which has a crystal structure classified into Crystalline (also referred to as Crystalline IGZO), are shown in FIG. 9B and FIG. 9C. FIG. 9B shows an XRD spectrum of quartz glass and FIG. 9C shows an XRD spectrum of Crystalline IGZO. Note that the Crystalline IGZO shown in FIG. 9C has a composition in vicinity of In:Ga:Zn=4:2:3 [atomic ratio]. Furthermore, the Crystalline IGZO shown in FIG. 9C has a thickness of 500 nm.

As indicated by arrows in FIG. 9B, the XRD spectrum of the quartz glass shows a peak with a substantially bilaterally symmetrical shape. In contrast, as indicated by arrows in FIG. 9C, the shape of the peak in the XRD spectrum of the Crystalline IGZO is asymmetrical. The asymmetrical peak of the XRD spectrum clearly shows the existence of crystal. In other words, the structure cannot be regarded as Amorphous unless it has a bilaterally symmetrical peak in the XRD spectrum. Note that in FIG. 9C, a crystal phase (IGZO crystal phase) is explicitly denoted at 2θ of 31° or in the vicinity thereof. The asymmetrical peak of the XRD spectrum probably result from the crystal phase (microcrystal).

Specifically, in the XRD spectrum of the Crystalline IGZO shown in FIG. 9C, the peak appears at 2θ of 34° or in the vicinity thereof. Furthermore, the microcrystal has a peak at 2θ of 31° or in the vicinity thereof. In the case of evaluating an oxide semiconductor film with an X-ray diffraction pattern, as shown in FIG. 9C, the spectral width on the low angle side of the peak at 2θ of 34° or in the vicinity thereof is wider. This indicates that the oxide semiconductor film includes a microcrystal having the peak at 2θ of 31° or in the vicinity thereof.

A crystal structure of a film can be evaluated with a diffraction pattern obtained by a nanobeam electron diffraction method (NBED) (such a pattern is also referred to as a nanobeam electron diffraction pattern). FIG. 9D shows a diffraction pattern of an IGZO film formed with the substrate temperature set at room temperature. Note that the IGZO film of FIG. 9D is formed by a sputtering method using an oxide target with In:Ga:Zn=1:1:1 [atomic ratio]. In the nanobeam electron diffraction method, electron diffraction is performed with a probe diameter of 1 nm.

As shown in FIG. 9D, not a halo pattern but a spot-like pattern is observed in the diffraction pattern of the IGZO film formed at room temperature. Thus, it is presumed that the IGZO film formed at room temperature is in an intermediate state, which is neither a crystal state nor an amorphous state, and it cannot be concluded that the IGZO film is in an amorphous state.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond length changed by substitution of a metal element, and the like.

A crystal structure in which a clear crystal grain boundary (grain boundary) is observed is what is called a polycrystal. It is highly probable that the crystal grain boundary becomes a recombination center and traps carriers and thus decreases the on-state current or field-effect mobility of a transistor. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. Meanwhile, in the CAAC-OS, a reduction in electron mobility due to a crystal grain boundary is unlikely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used in a transistor is described.

When the above oxide semiconductor is used in a transistor, a transistor with high field-effect mobility can be achieved. In addition, a transistor having high reliability can be achieved.

An oxide semiconductor with a low carrier concentration is preferably used for the transistor. In the case where the carrier concentration of an oxide semiconductor film is lowered, the impurity concentration in the oxide semiconductor film is lowered to decrease the density of defect states. In this specification and the like, a state with a low impurity concentration and a low density of defect states is sometimes referred to as a highly purified intrinsic or substantially highly purified intrinsic state.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, alkali metal, alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. Hence, nitrogen in the oxide semiconductor is preferably reduced as much as possible; the nitrogen concentration in the oxide semiconductor that is obtained by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor that is obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 4

In this embodiment, examples of electronic components and electronic devices in which the semiconductor device or the like described in the above embodiment is incorporated will be described.

<Electronic Devices>

Next, examples of an electronic device including the above solid-state relay will be described with reference to FIG. 10.

Figure 10:
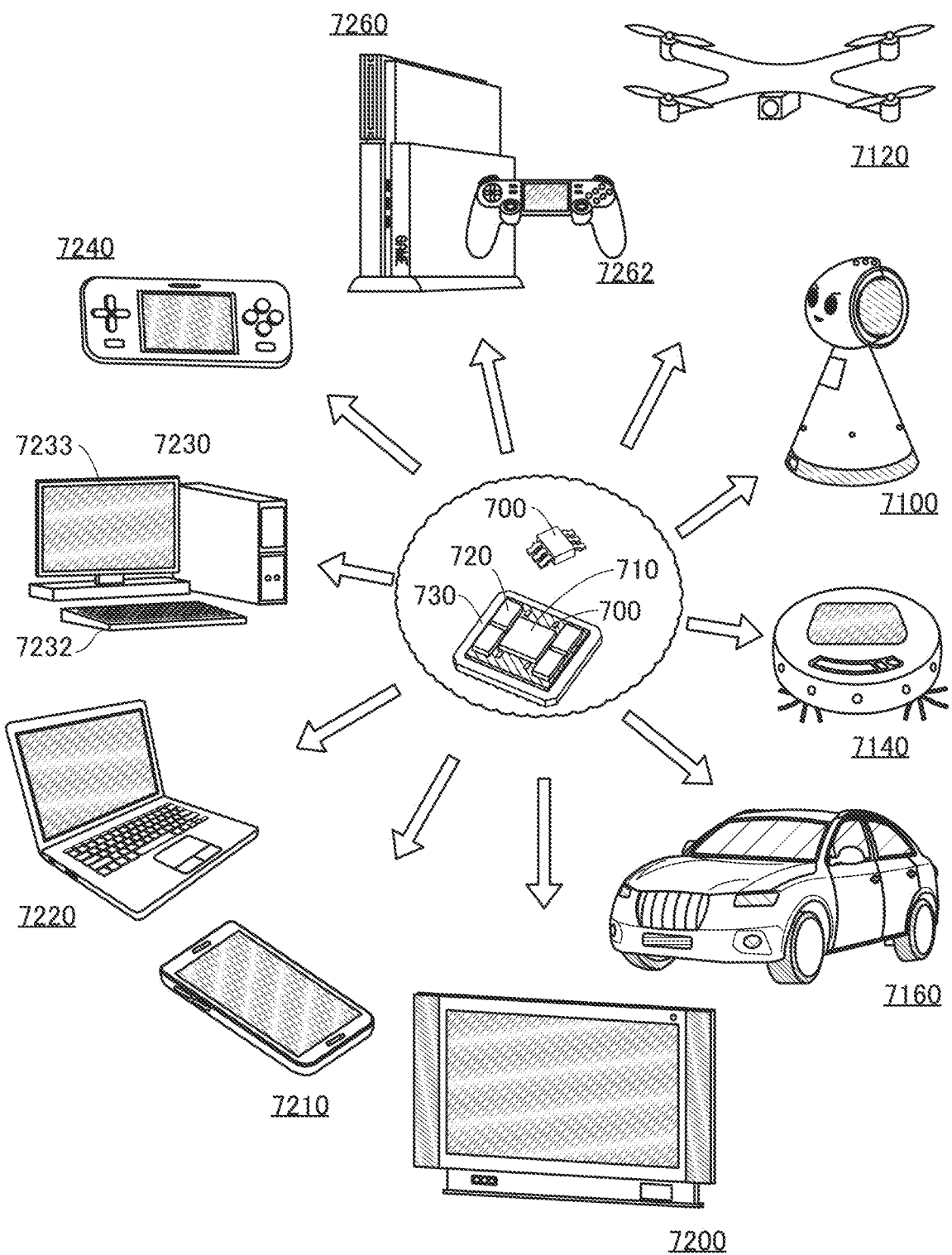
FIG. 10 is a diagram illustrating examples of electronic devices.

A perspective view of a solid-state relay 700 and a perspective view of a functional module 730 in which the solid-state relay 700, an electronic component 710 and a plurality of electronic components 720 are mounted are illustrated in the center of FIG. 10. Note that FIG. 10 illustrates an example in which the solid-state relay 700 is mounted on the functional module 730. For example, the electronic component 710 is preferably a processor. The electronic components 720 may be memories, memory modules, integrated circuits, or the like. Examples of the integrated circuits include image processing circuits, GPUs (Graphics Processing Units), control circuits, and driver circuits.

For example, the processor can control power gating of each memory or each memory module using the solid-state relay 700. Note that it is preferable that a DOSRAM (Dynamic Oxide Semiconductor Random Access Memory), a NOSRAM (Nonvolatile Oxide Semiconductor RAM), a flash memory, or the like in which an OS transistor is used as a selection switch be used as the memory.

An example in which the above-described functional module 730 includes the solid-state relay 700 and the processor will be described. Note that since Embodiment 1 can be referred to for the solid-state relay 700, detailed description thereof will be omitted. A first signal or a second signal is supplied to a first circuit included in the solid-state relay 700 by the processor. On or off of a first light-emitting element is controlled by the first signal supplied to the first circuit. On or off of a second light-emitting element is controlled by the second signal supplied to the first circuit.

First data converted into voltage by a first light-receiving element is supplied to a capacitor through a second transistor. Note that light emitted by the first light-emitting element is supplied to the first light-receiving element through the second transistor. A first transistor is controlled so as to be brought into conduction by the first data stored in the capacitor. The first data stored in the capacitor is initialized when a third transistor is brought into an on state by second data converted into voltage by a second light-receiving element. Note that light emitted by the second light-emitting element is supplied to the second light-receiving element. The first transistor is controlled so as to be brought into non-conduction when the first data stored in the capacitor is initialized. Thus, the solid-state relay 700 can facilitate power gating of the memory or the memory module.

As a different example, although not illustrated in FIG. 10, the electronic components included in the functional module 730 may include a motor or the like. Alternatively, the functional module 730 can drive a motor or the like. High power (e.g., a voltage greater than or equal to 10 V or greater than or equal to 100 V and a current greater than or equal to 1 A) is sometimes necessary for a signal for controlling the motor. For example, in the case where a voltage width of a signal output by the processor is 3.3 V, the solid-state relay 700 can be provided between a wiring of the signal for controlling the motor and a wiring supplied with a power supply voltage. Thus, even without a driver IC for controlling the motor, direct control from the processor becomes possible. Note that the above-described operation voltage of the processor or the motor is just an example and the operation voltage is not limited thereto.

As a different example, the solid-state relay 700, the electronic component 710, or the electronic component 720 may be a module or one chip by using SiP (System in package) or MCM (Multi Chip Module).

In order to mount the solid-state relay 700 on another substrate, a mounting method such as BGA (Ball Grid Array), PGA (Pin Grid Array), SPGA (Staggered Pin Grid Array), LGA (Land Grid Array), QFP (Quad Flat Package), QFJ (Quad Flat J-leaded package), or QFN (Quad Flat Non-leaded package) can be employed, for example.

The solid-state relay 700 or the functional module 730 can be used in a variety of electronic devices.

As an example, a robot 7100 includes, in addition to the functional module 730, a battery, a microphone module, a camera module, a speaker, a display, various kinds of sensors (e.g., an illuminance sensor, an infrared ray sensor, an ultrasonic wave sensor, an acceleration sensor, a piezo-electric sensor, an optical sensor, and a gyro sensor), a moving mechanism, and the like. The functional module 730 includes a processor and the like and has a function of controlling these peripheral devices. The functional module 730 can control power gating of the above-described sensor group or a motor that controls the operation of the robot. Accordingly, the power consumption of the battery can be reduced.

The robot 7100 can communicate with the user with the use of the microphone and the speaker. Thus, the microphone can detect acoustical signals of sound and environmental sound and analyze the contents. Note that AI is preferably used for the analysis of the contents. Accordingly, the amount of computation and the power consumption in the case of analyzing sound increase. Note that when the robot 7100 is stopped, the analysis of sound with the microphone is also stopped. Therefore, the microphone requires high power during the analysis of sound, and power gating is preferably performed during a stop of the analysis of sound by the microphone. Thus, it is preferable to use the solid-state relay mounted on the functional module 730.

The camera module has a function of taking images of the surroundings of the robot 7100. The robot 7100 has a function of moving with use of the moving mechanism. The robot 7100 can take images of the surroundings with use of the camera module, distinguish the user and sense whether there is an obstacle in the way of the movement by analyzing the images with AI. Therefore, the camera module requires high power during the analysis of the images, and power gating is preferably performed during a stop of the analysis of the images by the camera module. Thus, it is preferable to use the solid-state relay mounted on the functional module 730.

A flying vehicle 7120 includes a propeller control module, a camera module, a battery, and the like and has a function of flying autonomously. The functional module 730 has a function of controlling these peripheral devices. The flying vehicle 7120 can take images of the surroundings with use of the camera module and sense whether there is an obstacle in the way of the movement by analyzing the images with AI. The propeller module controls the state of the flying vehicle 7120 in accordance with the direction in which the flying vehicle 7120 moves, the direction and the speed of wind, and the like. The propeller module includes a motor. High power is required during driving of the motor, and power gating is preferably performed during a stop of the motor. Thus, it is preferable to use the solid-state relay mounted on the functional module 730.

A cleaning robot 7140 includes a motor that drives a tire for movement, a display provided on the top surface, a plurality of cameras provided on the side surface, a brush, an operation button, various kinds of sensors, and the like. A cleaning robot 7300 can run autonomously, detect dust, and vacuum the dust through the inlet provided on the bottom surface.

For example, the functional module 730 can analyze images taken by the cameras to judge whether there is an obstacle such as a wall, furniture, or a step. Images of the surroundings can be taken by the camera module, and the images can be analyzed with AI to judge whether there is an obstacle such as a wall, furniture, or a step. In the case where an object that is likely to be caught in the brush, such as a wire, is detected by image analysis, the rotation of the brush can be stopped.

An automobile 7160 includes an engine, tires, a brake, a steering gear, a camera, and the like. For example, the functional module 730 performs control for optimizing the running state of the automobile 7160 on the basis of navigation information, the speed, the state of the engine, the gearshift state, the use frequency of the brake, and other data. For example, image data taken by the camera is stored in the electronic component 720.

The solid-state relay 700 and/or the functional module 730 can be incorporated in a TV device 7200 (a television receiver), a smartphone 7210, PCs (personal computers) 7220 and 7230, a game machine 7240, a game machine 7260, and the like.

The functional module 730 incorporated in the TV device 7200 can function as an image processing engine, for example. The functional module 730 performs, for example, image processing such as noise removal and resolution up-conversion.

The smartphone 7210 is an example of a portable information terminal. The smartphone 7210 includes a microphone, a camera, a speaker, various kinds of sensors, and a display portion. These peripheral devices are controlled by the functional module 730.

The PC 7220 and the PC 7230 are examples of a laptop PC and a desktop PC. To the PC 7230, a keyboard 7232 and a monitor device 7233 can be connected with or without a wire. The game machine 7240 is an example of a portable game machine. The game machine 7260 is an example of a stationary game machine. To the game machine 7260, a controller 7262 is connected with or without a wire. The solid-state relay 700 and/or the functional module 730 can be incorporated in the controller 7262.

This embodiment can be implemented in combination with any of the structures described in the other embodiments and the like, as appropriate.

REFERENCE NUMERALS

11: terminal, 12: terminal, 13: terminal, 14: terminal, 15: terminal, 16: terminal, 100: solid-state relay, 101: circuit, 102: circuit, 104*a*: transistor, 104*c*: transistor, 110: lighting circuit, 110A: lighting circuit, 111: light-emitting element, 111A: light-emitting element, 112: light-emitting element, 112A: light-emitting element, 114: semiconductor layer, 120: detection circuit, 121: light-receiving element, 121A: light-receiving element, 121B: light-receiving element, 122: light-receiving element, 122A: light-receiving element, 122B: light-receiving element, 130: memory, 131: transistor, 132: transistor, 133: capacitor, 140: switch circuit, 140A: switch circuit, 141*a*: transistor, 141*b*: transistor, 141*c*: transistor, 144: diode, 210: substrate, 212: semiconductor layer, 212*a*: n-type region, 212*b*: p-type region, 213*a*: light-emitting layer, 213*b*: light-emitting layer, 214: semiconductor layer, 215: conductive layer, 215*a*: semiconductor layer, 215*b*: semiconductor layer, 216*a*: conductive layer, 216*b*: conductive layer, 216*c*: conductive layer, 216*d*: conductive layer, 216*e*: conductive layer, 216*f*: conductive layer, 217*a*: conductive layer, 217*b*: conductive layer, 218: insulating layer, 220: conductive layer, 222: insulating layer, 224: insulating layer, 224*a*: insulating layer, 226*a*: conductive layer, 226*b*: conductive layer, 228: insulating layer, 230*a*: semiconductor layer, 230*b*: semiconductor layer, 232: conductive layer, 232*a*: conductive layer, 232*b*: conductive layer, 232*c*: conductive layer, 234: insulating layer, 236*a*: conductive layer, 236*b*: conductive layer, 236*c*: conductive layer, 238: insulating layer, 240: conductive layer, 240*a*: conductive layer, 240*b*: conductive layer, 242: organic sensor layer, 242*a*: organic sensor layer, 242*b*: organic sensor layer, 242*d*: buffer layer, 242*e*: active layer, 242*f*: buffer layer, 244: conductive layer, 244*a*: conductive layer, 244*b*: conductive layer, 246: insulating layer, 248: insulating layer, 250: substrate, 252: semiconductor layer, 700: solid-state relay, 710: electronic component, 720: electronic component, 730: functional module, 7100: robot, 7120: flying vehicle, 7140: cleaning robot, 7160: automobile, 7200: TV device, 7210: smartphone, 7220: PC, 7230: PC, 7232: keyboard, 7233: monitor device, 7240: game machine, 7260: game machine, 7262: controller, 7300: cleaning robot

The invention claimed is:

1. A solid-state relay comprising a first circuit and a second circuit,
wherein the first circuit comprises a first light-emitting element and a second light-emitting element,
wherein the second circuit comprises a first light-receiving element, a second light-receiving element, a memory, and a first switch,
wherein the first switch, the first light-emitting element, and the second light-emitting element comprise a first semiconductor layer,
wherein the first light-receiving element comprises an active layer,
wherein the active layer comprises an organic compound,
wherein the first semiconductor layer comprises gallium,
wherein on or off of the first light-emitting element is controlled by a first signal supplied to the first circuit,
wherein on or off of the second light-emitting element is controlled by a second signal supplied to the first circuit,
wherein light emitted by the first light-emitting element by the first signal is supplied to the first light-receiving element,
wherein the first light-receiving element generates first data by converting the light into voltage,
wherein the first data is stored in the memory,
wherein the first switch is controlled so as to be brought into conduction by the first data stored in the memory,
wherein light emitted by the second light-emitting element by the second signal is supplied to the second light-receiving element, wherein the second light-receiving element generates second data by converting the light into voltage, wherein the first data stored in the memory is initialized by the second data, and wherein the first switch is controlled so as to be brought into non-conduction when the first data stored in the memory is initialized.

2. The solid-state relay according to claim 1, wherein the memory comprises a second switch, a third switch, and a capacitor, wherein the second switch and the third switch are over the first switch by using a second semiconductor layer, wherein the capacitor is over the second semiconductor layer, wherein the memory stores the first data in the capacitor by controlling the second switch, wherein the third switch is brought into an on-state by the second data, and wherein the first data stored in the capacitor is initialized when the third switch is brought into the on-state.

3. The solid-state relay according to claim 2, wherein the first semiconductor layer comprises nitrogen, and wherein the second semiconductor layer comprises oxygen.

4. The solid-state relay according to claim 2, wherein the first semiconductor layer comprises nitrogen or oxygen, and wherein the second semiconductor layer comprises indium, zinc, and oxygen.

5. The solid-state relay according to claim 1, wherein part of the first light-receiving element overlaps with the first light-emitting element.

6. The solid-state relay according to claim 1, further comprising a fluorescent substance, wherein the fluorescent substance is between the first light-emitting element and the first light-receiving element, and wherein the fluorescent substance converts a wavelength of light emitted by the first light-emitting element into a wavelength longer than the wavelength of the light emitted by the first light-emitting element.

7. A solid-state relay comprising a first circuit and a second circuit, wherein the first circuit comprises a first light-emitting element, a second light-emitting element, a first terminal, a second terminal, and a third terminal, wherein the second circuit comprises a first transistor, a second transistor, a third transistor, a first light-receiving element, a second light-receiving element, a capacitor, a fourth terminal, and a fifth terminal, wherein the first light-receiving element comprises an active layer, wherein the active layer comprises an organic compound, wherein the first terminal is electrically connected to one electrode of the first light-emitting element, wherein the third terminal is electrically connected to one electrode of the second light-emitting element, wherein the second terminal is electrically connected to the other electrode of the first light-emitting element and the other electrode of the second light-emitting element, wherein a gate of the first transistor is electrically connected to one of a source and a drain of the second transistor, one of a source and a drain of the third transistor, and one electrode of the capacitor, wherein the other of the source and the drain of the second transistor is electrically connected to a gate of the second transistor and one electrode of the first light-receiving element, wherein a gate of the third transistor is electrically connected to one electrode of the second light-receiving element, wherein the fourth terminal is electrically connected to one of a source and a drain of the first transistor, wherein the fifth terminal is electrically connected to the other of the source and the drain of the first transistor, the other of the source and the drain of the third transistor, the other electrode of the capacitor, the other electrode of the first light-receiving element, and the other electrode of the second light-receiving element, wherein light emitted by the first light-emitting element is supplied to the first light-receiving element, wherein light emitted by the second light-emitting element is supplied to the second light-receiving element, and wherein a wiring electrically connecting the gate of the first transistor, the one of the source and the drain of the second transistor, and the one of the source and the drain of the third transistor is positioned to block light so that the light emitted by the first light-emitting element does not enter the second light-receiving element and is positioned to block light so that the light emitted by the second light-emitting element does not enter the first light-receiving element.

8. A semiconductor device comprising the solid-state relay according to claim 7 and a processor, wherein a first signal or a second signal is supplied to the first circuit by the processor, wherein on or off of the first light-emitting element is controlled by the first signal supplied to the first circuit, wherein on or off of the second light-emitting element is controlled by the second signal supplied to the first circuit, wherein light emitted by the first light-emitting element by the first signal is supplied to the first light-receiving element, wherein the first light-receiving element generates first data by converting the light into voltage, wherein the first data is stored in the capacitor via the second transistor, wherein the first transistor is controlled so as to be brought into conduction by the first data stored in the capacitor, wherein light emitted by the second light-emitting element by the second signal is supplied to the second light-receiving element, wherein the second light-receiving element generates second data by converting the light into voltage, wherein the first data stored in the capacitor is initialized when the third transistor is brought into an on-state by the second data, wherein the first transistor is controlled so as to be brought into non-conduction when the first data stored in the capacitor is initialized, and wherein a voltage width of the fourth terminal supplied with the fifth terminal as a reference is larger than a voltage width of the first signal supplied by the processor.

9. A solid-state relay comprising a first circuit and a second circuit, wherein the first circuit comprises a first light-emitting element, wherein the second circuit comprises a first light-receiving element, a memory, and a first switch,
wherein the first switch and the first light-emitting element comprise a first semiconductor layer,
wherein the first light-receiving element comprises an active layer,
wherein the active layer comprises an organic compound,
wherein the first semiconductor layer comprises gallium,
wherein on or off of the first light-emitting element is controlled by a first signal supplied to the first circuit,
wherein light emitted by the first light-emitting element by the first signal is supplied to the first light-receiving element,
wherein the first light-receiving element generates first data by converting the light into voltage,
wherein the first data is stored in the memory, and
wherein conduction or non-conduction of the first switch is controlled by the first data.

10. The solid-state relay according to claim 9,
wherein part of the first light-receiving element overlaps with the first light-emitting element.

11. The solid-state relay according to claim 9,
further comprising a fluorescent substance,
wherein the fluorescent substance is between the first light-emitting element and the first light-receiving element, and
wherein the fluorescent substance converts a wavelength of light emitted by the first light-emitting element into a wavelength longer than the wavelength of the light emitted by the first light-emitting element.

* * * * *